US012615050B2

(12) United States Patent
Kim

(10) Patent No.: US 12,615,050 B2
(45) Date of Patent: Apr. 28, 2026

(54) SEMICONDUCTOR DEVICE

(71) Applicant: Samsung Electronics Co., Ltd.,
Suwon-si (KR)

(72) Inventor: Hyochang Kim, Suwon-si (KR)

(73) Assignee: **SAMSUNG ELECTRONICS CO.,
LTD.**, Suwon-si (KR)

( * ) Notice: Subject to any disclaimer, the term of this
patent is extended or adjusted under 35
U.S.C. 154(b) by 0 days.

(21) Appl. No.: 18/931,778

(22) Filed: Oct. 30, 2024

(65) Prior Publication Data

US 2025/0323651 A1 Oct. 16, 2025

(30) Foreign Application Priority Data

Apr. 11, 2024 (KR) ........................ 10-2024-0048545

(51) Int. Cl.
  *H03L 7/107* (2006.01)
  *H03L 7/091* (2006.01)
(52) U.S. Cl.
  CPC .............. *H03L 7/107* (2013.01); *H03L 7/091*
  (2013.01)
(58) Field of Classification Search
  CPC ................................ H03L 7/107; H03L 7/091
  USPC ........................................................ 327/156
  See application file for complete search history.

(56) References Cited

U.S. PATENT DOCUMENTS 7,051,225 B2 5/2006 Nishio et al.
7,840,831 B2 11/2010 Jang

| 8,553,473 B2 | 10/2013 | Kim et al. | |
| 9,461,653 B2 | 10/2016 | Perrott | |
| 10,963,002 B1 | 3/2021 | Hafizi | |
| 11,063,595 B1 * | 7/2021 | Zhang | H04B 1/38 |
| 11,309,001 B2 | 4/2022 | Kim | |
| 2007/0183553 A1 | 8/2007 | Sanders et al. | |
| 2020/0160902 A1 | 5/2020 | Gans | |
| 2024/0029779 A1 * | 1/2024 | Kuzmenka | H03K 3/0315 |
| 2025/0175168 A1 * | 5/2025 | Chen | H03K 5/249 |

OTHER PUBLICATIONS

K. Hyochang et al., "Duty-cycle and phase spacing error correction
circuit for high-speed serial link", Jun. 1, 2017, 1-7, IEICE Elec-
tronics Express, vol. 14, No. 12, Seoul, Korea.

* cited by examiner

*Primary Examiner* — Tomi Skibinski
(74) *Attorney, Agent, or Firm* — Muir Patent Law, PLLC

(57) ABSTRACT

A semiconductor device includes a multiphase clock gen-
erator generating clock signals by dividing a data clock
signal, adjusting phases of the clock signals based on a
control code set to generate a multiphase clock, a first data
strobe module generating first and second serial signals from
first and second data sequences using the multiphase clock,
a phase error detector comparing a first length of a first rising
period of the first serial signal and a second length of a
second rising period of the second serial signal to generate
a comparison result, a register storing the comparison result,
and a control logic determining code values of the control
code set by referring to the comparison result so that phase
intervals between the clock signals are equalized with each
other, and correcting a phase of the multiphase clock by
storing the code values of the control code set in the register.

20 Claims, 19 Drawing Sheets i=1 (IB)
i=2 (QB)
i=3 (Q)

START

S110 i=1

S120

S121

INPUT SEQ1 AND SEQ2
DETERMINED FOR
ITH SEQUENCE

S122

DETERMINE CONTROL CODE AT
WHICH COMPARISON RESULT
COMP TOGGLES FROM 0 TO 1

S140 i←i+1

S130 i=3 ?

NO

YES

END

SEMICONDUCTOR DEVICE

CROSS-REFERENCE TO RELATED APPLICATION(S)

This application claims benefit of priority to Korean Patent Application No. 10-2024-0048545 filed on Apr. 11, 2024 in the Korean Intellectual Property Office, the disclosure of which is incorporated herein by reference in its entirety.

BACKGROUND

Example embodiments of the present disclosure relate to a semiconductor device.

A memory device may operate in synchronization with a clock applied from an external entity. To support rapid input and output of data, a memory device may process data using a multiphase clock including clock signals having the same frequency and different phases.

A phase error in which phase intervals between clock signals is not uniform may occur due to various causes such as noise in a memory device. By detecting and correcting such a phase error of clock signals, performance of the memory device may be improved.

SUMMARY

An example embodiment of the present disclosure is to provide a semiconductor device including an internal circuit which may detect and correct phase errors of clock signals included in a multiphase clock.

According to an aspect of the present disclosure, a semiconductor device includes a multiphase clock generator generating a plurality of clock signals by dividing a data clock signal, adjusting phases of the plurality of clock signals based on a control code set to generate a plurality of phase-adjusted clock signals, and outputting the plurality of phase-adjusted clock signals as a multiphase clock, a first data strobe module generating a first serial signal by serializing a first data sequence using the multiphase clock, a second data strobe module generating a second serial signal by serializing a second data sequence using the multiphase clock, a phase error detector comparing a first length of a first rising period of the first serial signal and a second length of a second rising period of the second serial signal to generate a comparison result, a register storing the control code set, the first data sequence, the second data sequence, and the comparison result, and a control logic connected to the register, determining code values of the control code set by referring to the comparison result so that phase intervals between the plurality of clock signals are equalized with each other, and correcting a phase of the multiphase clock by storing the code values of the control code set in the register.

According to an aspect of the present disclosure, a semiconductor device includes a multiphase clock generator generating a first clock signal and a second clock signal having a phase inverted from the first clock signal using a data clock signal, adjusting a phase of the second clock signal based on a first control code, and outputting a multiphase clock including the first clock signal and the second clock signal, a first serializer outputting a first serial signal by serializing a first data sequence using the multiphase clock, a second serializer outputting a second serial signal by serializing a second data sequence using the multiphase clock, a phase error detector connected to the first serializer and the second serializer and outputting a first comparison result by comparing a first rising period of the first serial signal and a second rising period of the second serial signal, and a control logic controlling the first serializer to generate the first serial signal having the first rising period between a first rising edge of the first clock signal and a second rising edge of the second clock signal by inputting the first data sequence to the first serializer, controlling the second serializer to generate the second serial signal having the second rising period between the second rising edge of the second clock signal and the first rising edge of the first clock signal by inputting the second data sequence to the second serializer, obtaining the first comparison result from the phase error detector, and correcting the phase of the second clock signal by determining a value of the first control code based on the first comparison result.

According to an aspect of the present disclosure, a semiconductor device includes a multiphase clock generator generating a plurality of clock signals by dividing a data clock signal, adjusting a phase of each of the plurality of clock signals based on a control code set to generate a plurality of phase-adjusted clock signals, and outputting the plurality of phase-adjusted clock signals as a multiphase clock, a phase error detector generating a plurality of pulse clock signals from the plurality of phase-adjusted clocks signals, wherein each of the plurality of pulse clock signals has a rising period between rising edges of corresponding two adjacent phase-adjusted clock signals among the plurality of phase-adjusted clock signals, and wherein the corresponding two adjacent phase-adjusted clock signals are selected from the plurality of phase-adjusted clock signals based on a select signal, and outputting a plurality of comparison results, wherein each of the plurality of comparison results is obtained by comparing a direct current level corresponding to a length of a rising period of a corresponding one of the plurality of pulse clock signals and a reference level corresponding to an input digital code value, a register configured to store the control code set, the select signal and the comparison result, and a control logic connected to access to the register, repeatedly perform an operation of determining a corresponding digital code value corresponding to the direct current level by performing a search for candidate input signal code values on the plurality of pulse clock signals to generate a plurality of corresponding digital code values of the plurality of pulse clock signals, determining a reference value based on the plurality of corresponding digital code values of the plurality of pulse clock signals, determining the control code set in which each of the plurality of corresponding digital code values of the plurality of pulse clock signals is equalized to the reference value, and correcting a phase of the multiphase clock by inputting the determined control code set to the register.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, embodiments of the present disclosure will be described as follows with reference to the accompanying drawings.

Figure 1:
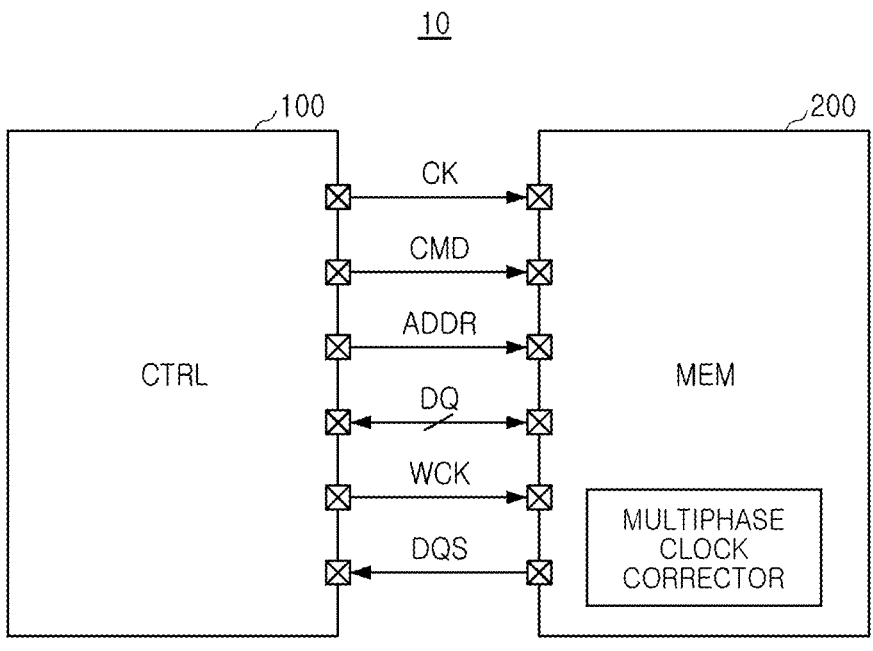
FIG. 1 is a diagram illustrating a memory system according to an example embodiment of the present disclosure.

FIG. 1 is a diagram illustrating a memory system according to an example embodiment.

Referring to FIG. 1, a memory system 10 may include a memory controller 100 and a memory device 200.

The memory system 10 may be implemented to be included in a personal computer (PC) or a mobile electronic device. The mobile electronic device may be implemented as a laptop computer, a mobile phone, a smartphone, tablet PC, a personal digital assistant (PDA), an enterprise digital assistant (EDA), a digital still camera, a digital video camera, a portable multimedia player (PMP), a personal navigation device (PND), a handheld game console, a mobile Internet device (MID), a wearable computer, an Internet of Things device (IoT), an Internet of Everything device (IoE), or a drone.

The memory controller 100 may be implemented as an integrated circuit, a system on chip (SoC), an application processor (AP), a mobile AP, a chipset, or a set of chips. The memory controller 100 may include a random access memory (RAM), a central processing unit (CPU), a graphics processing unit (GPU), a neural processing unit (NPU), or a modem. In an example embodiment, the memory controller 100 may perform functions of a modem and an AP.

The memory device 200 may be implemented as a volatile memory device. A volatile memory device may be implemented as a random access memory (RAM), a dynamic RAM (DRAM), a static RAM (SRAM), or a low power double data rate (LPDDR) DRAM. In another example embodiment, the memory device 200 may be implemented as a nonvolatile memory device. The nonvolatile memory device may be implemented as an electrically erasable programmable read-only memory (EPROM), a NOR flash memory, a NAND flash memory, a magnetoresistive random access memory (MRAM), a spin transfer torque (STT)-MRAM, a ferroelectric RAM (FeRAM), a phase change RAM (PRAM), a resistor memory (resistive RAM; RRAM), a nanotube RRAM (nanotube RRAM), a polymer RAM (PoRAM), a nanofloating gate memory (NFGM), a holographic memory, a molecular electronics memory device, or an insulator resistance change memory.

The memory controller 100 may control the memory device 200 to read data stored in the memory device 200 or to write data to the memory device 200. The memory controller 100 may control a write operation or a read operation for the memory device 200 by providing a command signal CMD and an address signal ADDR to the memory device 200 in synchronization with a control clock signal CK.

Also, the data signal DQ may be transmitted and received between the memory controller 100 and the memory device 200 in synchronization with a data clock signal WCK. For example, during a write operation, the memory controller 100 may provide a data clock signal WCK along with a data signal DQ to the memory device 200, and the memory device 200 may sample the data signal DQ using the data clock signal WCK. During a read operation, the memory device 200 may provide a data strobe signal DQS generated using the data clock signal WCK together with the data signal DQ to the memory controller 100, and the memory controller 100 may sample the data signal DQ using the data strobe signal DQS.

The memory device 200 may process the data signal DQ using a multiphase clock to support rapid input and output of data. For example, the memory device 200 may divide the data transmission clock WCK received from the memory controller 100 to generate a multiphase clock including clock signals having the same frequency and different phases. The memory device 200 may convert the data signal DQ into a plurality of signals having a low data transmission rate by parallelizing the data signal DQ using the multiphase clock, and may parallelize the plurality of signals.

Due to various causes, such as a process error of the memory device 200, a phase error in which phase intervals of clock signals included in the multiphase clock is not uniform may occur. The phase error may reduce performance of the memory device 200, such as reducing an effective data margin of the data signal DQ.

In the case in which the phase error of the clock signals is detected by externally measuring a current of a signal pin of the memory device 200, speed and accuracy of the operation to detect and correct the phase error may deteriorate. Also, in a circumstance in which a processor tests a plurality of memory devices at once, it may be difficult to perform an operation of detecting and correcting phase errors of the plurality of memory devices in parallel. Consequently, the test time may increase.

In an example embodiment, the memory device 200 may include a circuit for detecting and correcting a phase error, and may internally detect a phase interval of clock signals using the circuit. Accordingly, the phase errors may be swiftly and accurately detected and corrected. In a test environment, phase errors of the plurality of memory devices may be simultaneously detected and corrected.

In the description below, before describing the circuit device according to an example embodiment in greater detail, the multiphase clock will be described in greater detail with reference to FIGS. 2, 3A and 3B.

Figure 2:
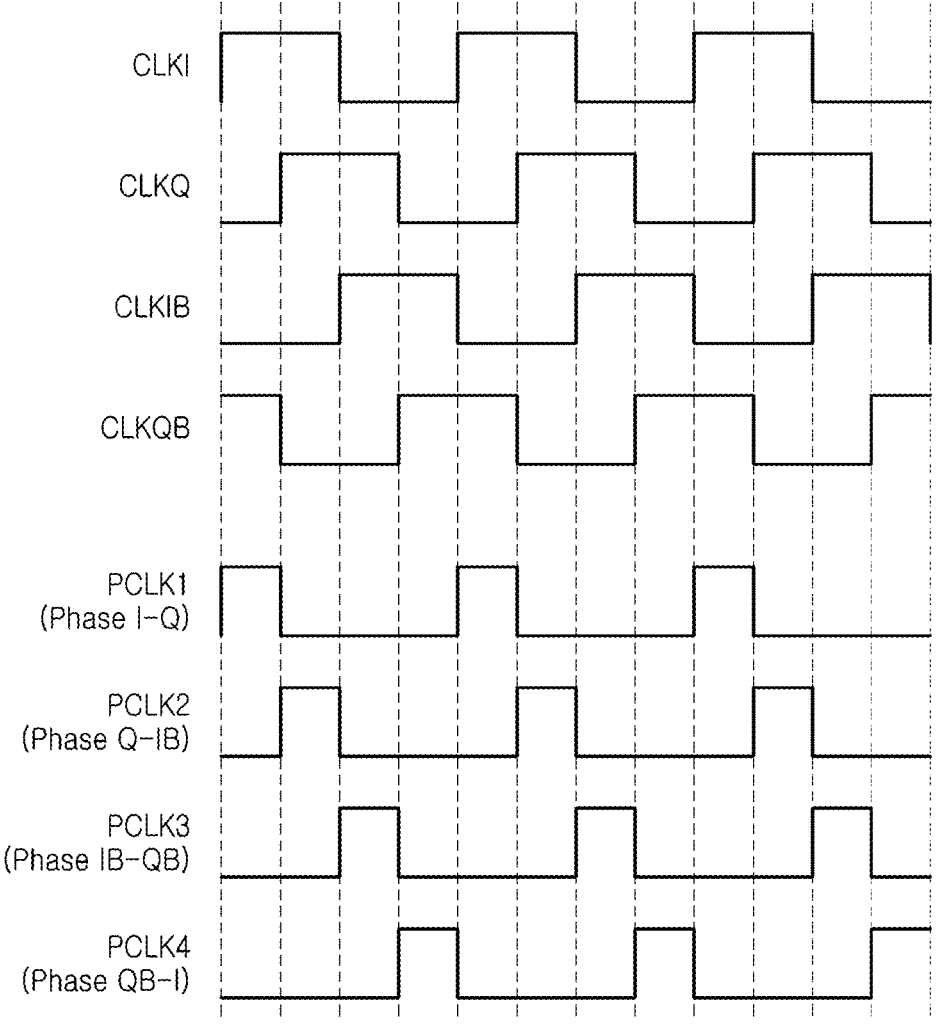
FIG. 2 is a diagram illustrating multiphase clock and pulse signals based on the multiphase clock according to an example embodiment of the present disclosure.

FIG. 2 is a diagram illustrating a multiphase clock and pulse signals based on the multiphase clock according to an example embodiment.

FIG. 2 illustrates a quadrature phase clock as an example of a multiphase clock. A quadrature phase clock may ideally include four clock signals having a phase interval of 90° therebetween. For example, the clock signals may include a first clock signal CLKI, a second clock signal CLKQ having a phase interval of 90° with the first clock signal CLKI, a third clock signal CLKIB having a phase interval of 90° with the second clock signal CLKQ and a fourth clock signal CLKQB having a phase interval of 90° with the third clock signal CLKIB. For example, the second clock signal CLKQ is 90° out of phase with the first clock signal CLKI, the third clock signal CLKIB is 90° out of phase with the second clock signal CLKQ, and the fourth clock signal CLKQB is 90° out of phase with the third clock signal CLKIB. In other words, the second clock signal CLKQ is delayed from the first clock signal by a phase of 90°, the third clock signal CLKIB is delayed from the second clock signal CLKQ by a phase of 90°, and the fourth clock signal CLKQB is delayed from the third clock signal CLKIB by a phase of 90°.

The first clock signal CLKI, the second clock signal CLKQ, the third clock signal CLKIB and the fourth clock signal CLKQB may be referred to as an identical phase clock signal, an orthogonal phase clock signal, an inverted identical phase clock signal and an inverted orthogonal phase clock signal, respectively.

In the memory device 200 described with reference to FIG. 1, the data signal DQ received from an external entity may be parallelized into a plurality of data signals by sampling at rising edges of the plurality of clock signals CLKI, CLKQ, CLKIB, and CLKQB. The plurality of data signals generated in the memory device 200 may be serialized into the data signal DQ by being alternately sampled from the rising edges of the plurality of clock signals CLKI, CLKQ, CLKIB, and CLKQB.

FIG. 2 illustrates pulse clock signals PCLK1, PCLK2, PCLK3, and PCLK4 having a rising period between rising edges of adjacent clock signals among the plurality of clock signals CLKI, CLKQ, CLKIB, and CLKQB. Adjacent clock signals may refer to two clock signals of which phase differences of rising edges are closest among the plurality of clock signals CLKI, CLKQ, CLKIB, and CLKQB.

For example, the first pulse clock signal PCLK1 may have a rising period between the rising edges of the first clock signal CLKI and the second clock signal CLKQ, the second pulse clock signal PCLK2 may have rising edges of the second clock signal CLKQ and the third clock signal CLKIB, the third pulse clock signal PCLK3 may have a rising period between the rising edges of the third clock signal CLKIB and the fourth clock signal CLKQB, and the fourth pulse clock signal PCLK4 may have a rising period between the rising edges of the fourth clock signal CLKQB and the first clock signal CLKI.

Lengths of the rising periods of the plurality of pulse clock signals PCLK1-PCLK4 may correspond to a phase interval (i.e., a phase difference) of the adjacent clock signals. The phase interval of adjacent clock signals may affect quality of a data signal sampled using a multiphase clock.

Figure 3A:
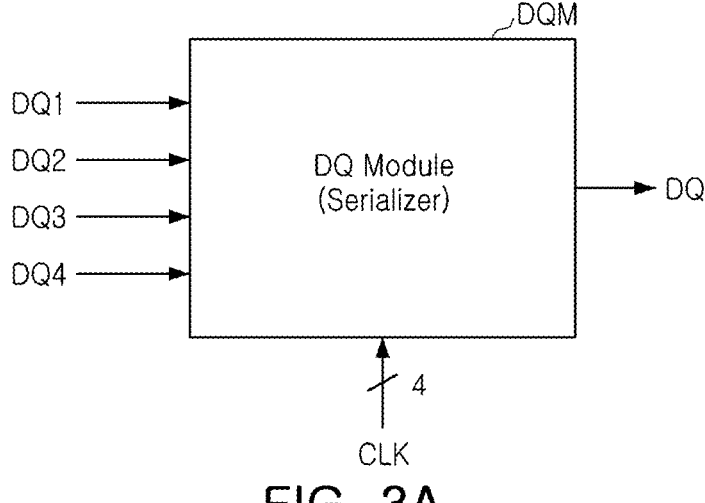
FIGS. 3A and 3B are diagrams illustrating a data sampling method using a multiphase clock according to an example embodiment of the present disclosure.
Figure 3B:
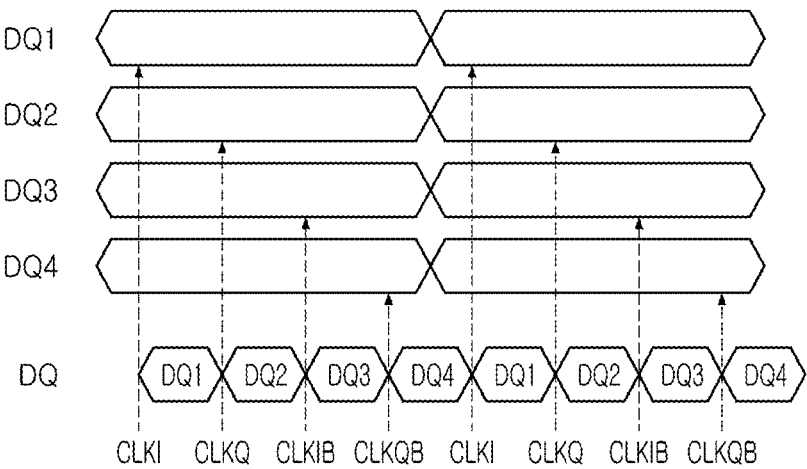

FIGS. 3A and 3B are diagrams illustrating a data sampling method using a multiphase clock according to an example embodiment. Specifically, FIG. 3A is a block diagram illustrating a data signal module DQM for data signal processing, and FIG. 3B is a signal diagram illustrating a data signal input and output by the data signal module DQM.

Referring to FIG. 3A, the data signal module DQM may include a serializer configured to output a serialized data signal DQ by alternately sampling parallelized data signals DQ1, DQ2, DQ3, and DQ4 at rising edges of the multiphase clock CLK.

For example, the parallelized data signals DQ1-DQ4 may be generated in the memory device 200 described with reference to FIG. 1, and the serialized data signals DQ may be output by the memory device 200 to an external entity. The serialized data signal DQ may have a frequency higher than those of the parallelized data signals DQ1-DQ4. That is, the memory device 200 may process the data signals DQ1-DQ4 having a relatively low data transmission rate (i.e., a first data transmission rate), may convert the data signals DQ1-DQ4 into the data signal DQ having a relatively high data transmission rate (i.e., a second data transmission rate), and may output the data signal DQ to an external entity, thereby providing high data processing performance to an external entity. In an embodiment, the second data transmission rate may be higher than the first data transmission rate.

Referring to FIG. 3B, among the parallelized data signals DQ1-DQ4, the first data signal DQ1 may be sampled at a rising edge of the first clock signal CLKI, the second data signal DQ2 may be sampled at a rising edge of the second clock signal CLKQ, the third data signal DQ3 may be sampled at a rising edge of the third clock signal CLKIB, and the fourth data signal DQ4 may be sampled at a rising edge of the fourth clock signal CLKQB.

The data signal DQ output by the data signal module DQM may have a first data signal DQ1 in a rising period of the first pulse clock signal PCLK1 as described with reference to FIG. 2, may have a second data signal DQ2 in a rising period of the second pulse clock signal PCLK2, may have a third data signal DQ3 in a rising period of the third pulse clock signal PCLK3 and may have a fourth data signal DQ4 in a rising period of the fourth pulse clock signal PCLK4.

Due to various noises in the memory device 200, a phase interval of the clock signals CLKI, CLKQ, CLKIB, and CLKQB may not be maintained at 90°. When the phase interval of the clock signals CLKI, CLKQ, CLKIB, and CLKQB is not maintained at 90°, rising periods of the pulse clock signals PCLK1, PCLK2, PCLK3, and PCLK4 may not be maintained uniformly. Accordingly, in the data signal DQ, the first to fourth data signals DQ1-DQ4 may not have a uniform time length, and quality of the data signal DQ may deteriorate.

In the description below, a multiphase clock corrector which may correct a phase error of the multiphase clock CLK in the memory device 200 according to an example embodiment will be described in greater detail.

Figure 4:
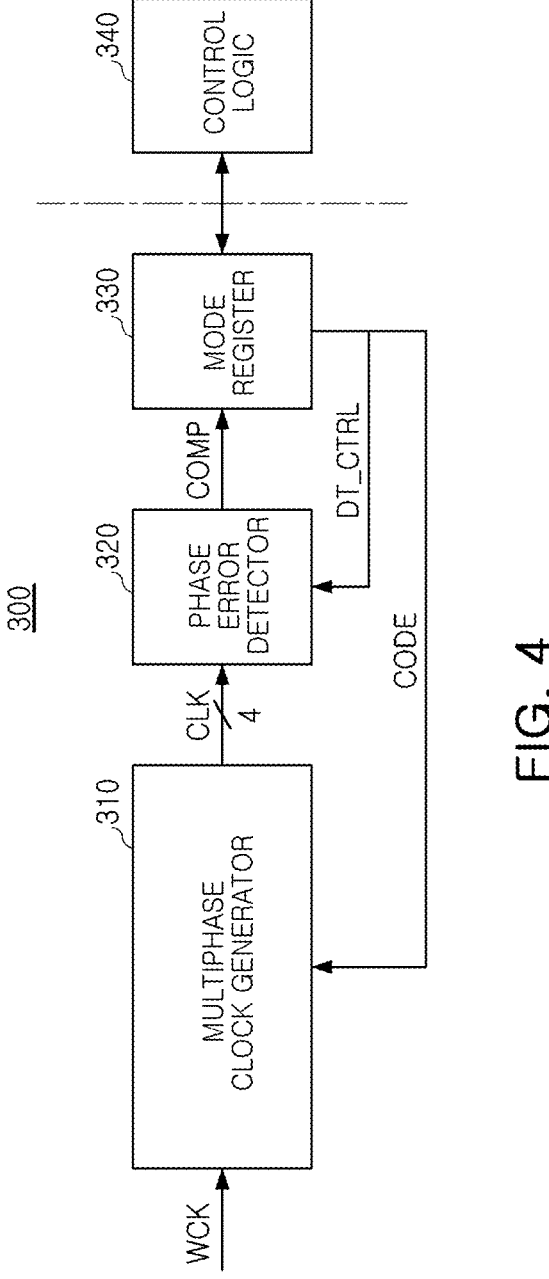
FIG. 4 is a diagram illustrating a multiphase clock corrector according to an example embodiment of the present disclosure.

FIG. 4 is a diagram illustrating a multiphase clock corrector according to an example embodiment.

Referring to FIG. 4, a multiphase clock corrector 300 may include a multiphase clock generator 310, a phase error detector 320, a mode register 330 and a control logic 340.

The multiphase clock generator 310 may generate a plurality of clock signals using the data clock signal WCK, may adjust a phase of the plurality of generated clock signals based on a control code set CODE, and may output a plurality of the phase-adjusted clock signals as multiphase clocks CLK.

The phase error detector 320 may measure data related to at least one phase among the plurality of clock signals output by the multiphase clock generator 310 based on a detect control signal DT_CTRL, and may output a comparison result COMP, which may be a digitized signal of the measurement result.

The mode register 330 may be accessed by the multiphase clock generator 310 and the phase error detector 320, and may store the control code set CODE, the detect control signal DT_CTRL and the comparison result COMP.

The control logic 340 may control the multiphase clock generator 310 and the phase error detector 320 by accessing the mode register 330.

For example, the control logic 340 may provide the detect control signal DT_CTRL to the phase error detector 320 through the mode register 330, may obtain the comparison result COMP from the phase error detector 320, and may determine the control code set CODE which may allow phase intervals of the multiphase clocks CLK to be equalized. The control logic 340 may control a phase of the multiphase clock CLK of the multiphase clock generator 310 by storing the control code set CODE in the mode register 330.

In an example embodiment, the multiphase clock generator 310, the phase error detector 320, the mode register 330 and the control logic 340 may be included in the memory device 200 described with reference to FIG. 1. However, an example embodiment thereof is not limited thereto.

For example, the multiphase clock generator 310, the phase error detector 320, and the mode register 330 may be included in the memory device 200, and the control logic 340 may be included in the memory controller 100 described with reference to FIG. 1. When the control logic 340 is included in the memory controller 100, the control logic 340 may access the mode register 330 using a mode register read MRR command and a mode register write MRW command defined in a product specification defining operations of the memory device 200.

In an example embodiment, the phase error detector 320 may measure data related to a phase of the multiphase clock CLK and may output a comparison result COMP. Obtaining phase information of the multiphase clock CLK using the comparison result COMP and determining the control code set CODE may be performed by the control logic 340. Accordingly, the circuit structure of the phase error detector 320 may be simplified, and the phase error detector 320 may be included in the memory device 200.

In an example embodiment, detecting and correcting the phase of the multiphase clock CLK may be performed using data obtained in the memory device 200, such that the speed and accuracy of the detecting and correcting the phase may be improved. Also, the circuit structure of the phase error detector 320, which may obtain data related to the phase in the memory device 200, may be simplified, such that a circuit area of the memory device 200 may be reduced and power consumption may be reduced.

In the description below, an example of the memory device 200 to which the multiphase clock corrector 300 according to an example embodiment may be applied will be described in greater detail with reference to FIG. 5.

Figure 5:
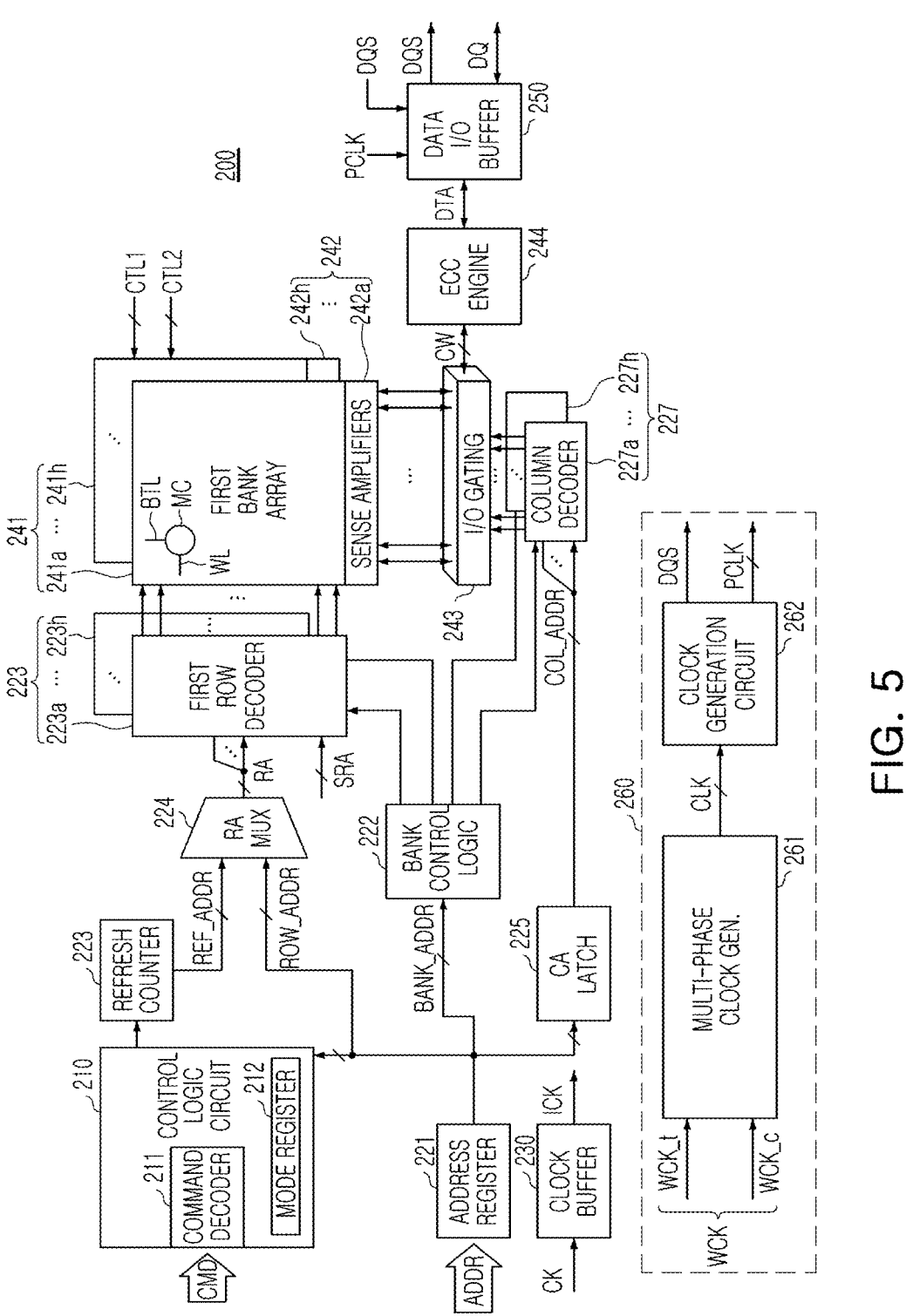
FIG. 5 is a diagram illustrating a memory device according to an example embodiment of the present disclosure.

FIG. 5 is a diagram illustrating a memory device according to an example embodiment.

Referring to FIG. 5, the memory device 200 may include a control logic circuit 210, an address register 221, a bank control circuit 222 (i.e., bank control logic), a refresh counter 223, a row address multiplexer 224, a column address latch 225, a row decoder 226, a column decoder 227, a clock buffer 230, a memory cell array 241, a sense amplifier 242, an input/output gate circuit 243, an ECC engine 244, a data input/output buffer 250, and a data clock circuit 260.

The memory cell array 241 may include a plurality of memory cell arrays 241a-241h. Also, the plurality of row decoders 226 (226a-226h), the plurality of column decoders 227 (227a-227h), and the plurality of sense amplifiers 242 (242a-242h) may be connected to the plurality of memory cell arrays 241a-241h, respectively.

The plurality of memory cell arrays 241a-241h, the plurality of sense amplifiers 242a-242h, the plurality of column decoders 227a-227h and the plurality of row decoders 226a-226h may be included in each of the plurality of banks. Each of plurality of memory cell arrays 241a-241h may include a plurality of wordlines WL and a plurality of bitlines and a plurality of memory cells MC formed at intersections of the wordlines WL and the bitlines.

The address register 221 may receive an address ADDR including a bank address BANK_ADDR, a row address ROW_ADDR and a column address COL_ADDR from the memory controller 100 described with reference to FIG. 1. The address register 221 may provide the received bank address BANK_ADDR to the bank control logic 222, the received row address ROW_ADDR to the row address multiplexer 224, and the received column address COL_ADDR to the column address latch 225.

The bank control logic 222 may generate bank control signals in response to the bank address BANK_ADDR. In response to the bank control signals, a row decoder corresponding to the bank address BANK_ADDR among the plurality of row decoders 224a-224h may be activated, and a column decoder corresponding to the bank address BANK_ADDR among the plurality of column decoders 227a-227h may be activated.

The row address multiplexer 224 may receive a row address ROW_ADDR from the address register 221 and a refresh row address REF_ADDR from the refresh counter 223. The row address multiplexer 224 may selectively output the row address ROW_ADDR or a refresh row address REF_ADDR as a row address RA. The row address RA output by the row address multiplexer 224 may be applied to each of the plurality of row decoders 226a-226h.

The refresh counter 223 may sequentially increase or decrease the refresh row address REF_ADDR under control of the control logic circuit 210.

Among the plurality of row decoders 226a-226h, the row decoder activated by the bank control logic 222 may decode the row address RA output by the row address multiplexer 224 and may activate a wordline corresponding to the row address. For example, the activated row decoder may apply a wordline driving voltage to the wordline corresponding to the row address.

The column address latch 225 may receive the column address COL_ADDR from the address register 221 and may temporarily store the received column address COL_ADDR.

Also, the column address latch 225 may gradually increase the received column address COL_ADDR in a burst mode. The column address latch 225 may apply the temporarily stored or gradually increased column address COL_ADDR to each of the plurality of column decoders 227a-227h.

Among the plurality of column decoders 227a-227h, the column decoder activated by the bank control logic 222 may activate the sense amplifier corresponding to the bank address BANK_ADDR and the column address COL_ADDR through the corresponding input/output gating circuit 243.

The input/output gating circuit 243 may include circuits for gating input and output data, an input data mask logic, read data latches to store data output by the plurality of memory cell arrays 241a-241h, and write drivers for writing data to the plurality of memory cell arrays 241a-241h.

The codeword CW to be read from a bank array of one of the plurality of memory cell arrays 241a-241h may be sensed by a sense amplifier corresponding to the bank array and may be stored in the read data latches. The codeword CW stored in the read data latches may be ECC decoded by the ECC engine 244 and may be provided to the data input/output buffer 250 as data DTA, and the data input/output buffer 250 may convert the data DTA into data DQ based on the pulse clock signals PCLK and may provide the signal to the memory controller 100 along with the data strobe signal DQS. In an embodiment, the data DTA may correspond to the first to fourth data signals DQ1 to DQ4 as described with reference to FIGS. 3A and 3B, and the data DQ of FIG. 5 may correspond to the data DQ sampled from the first to fourth data signals DQ1 to DQ4 using the pulse clock signals PCLK1 to PCLK4 as described with reference to FIGS. 2 and 3A and 3B.

The data signal DQ to be written to a bank array of one of the plurality of memory cell arrays 241a-241h may be converted to the data DTA by the data input/output buffer 250 and may be provided to the ECC engine 244. The ECC engine 244 may generate parity bits based on the data DTA and may provide a codeword CW including the data DTA and the parity bits to the input/output gating circuit 243. The input/output gating circuit 243 may write the codeword CW to a target page of the bank array through the write drivers.

In a write operation, the data input/output buffer 250 may convert the data signal DQ to data DTA and may provide the data to the ECC engine 244, and in a read operation, the data input/output buffer 250 may convert the data DTA provided from the ECC engine 244 into the data signal DQ based on the pulse clock signal PCLK provided by the clock generation circuit 262. The provided data DTA may be converted to the data signal DQ. The data input/output buffer 250 may provide the data signal DQ and the data strobe signal DQS to the memory controller 100 during a read operation. In an embodiment, the data input/output buffer 250 may correspond to a serializer/deserializer circuit which serves as a serializer in a read operation and as a deserializer in a write operation.

The ECC engine 244 may perform ECC encoding and ECC decoding on the data signal DQ based on a control signal from the control logic circuit 210.

The clock buffer 230 may receive the control clock signal CK, may generate an internal clock signal ICK by buffering the control clock signal CK, and may provide the internal clock signal ICK as elements processing a command CMD and an address ADDR.

The control logic circuit 210 may control operation of the memory device 200. For example, the control logic circuit 210 may generate control signals such that the memory device 200 may perform a write operation or a read operation. The control logic circuit 210 may include a command decoder 211 for decoding the command CMD received from the memory controller 100 and a mode register 212 for setting an operation mode of the memory device 200.

For example, the command decoder 211 may generate the control signals corresponding to the command CMD by decoding a write enable signal, a row address strobe signal, a column address strobe signal, a chip select signal, or the like.

The data clock circuit 260 may include a multiphase clock generator 261 and a clock generation circuit 262.

The multiphase clock generator 261 may receive a data clock signal WCK including differential clock signal pairs WCK_t and WCK_c, and may generate a multiphase clock CLK using the data clock signal WCK. As described with reference to FIG. 2, the multiphase clock CLK may include a plurality of clock signals CLKI, CLKQ, CLKIB, and CLKQB.

The clock generation circuit 262 may generate a data strobe signal DQS and pulse clock signals PCLK using the multiphase clock CLK.

As described with reference to FIG. 4, the multiphase clock corrector 300 may include the multiphase clock generator 310, the phase error detector 320, the mode register 330 and the control logic 340. The multiphase clock generator 310 may correspond to the multiphase clock generator 261, and the mode register 330 may correspond to the mode register 212. The control logic 340 may correspond to the control logic circuit 210 and may also be included in the external memory controller 100.

The memory device 200 may further include a phase error detector 320 for correcting a phase of the multiphase clock CLK generated based on the data clock signal WCK using the data strobe signal DQS or the multiphase clock CLK.

In the description below, a multiphase clock corrector and a method of correcting a multiphase clock for correcting a phase of the multiphase clock CLK based on the data strobe signal DQS will be described in greater detail according to an example embodiment with reference to FIGS. 6 to 10.

Figure 6:
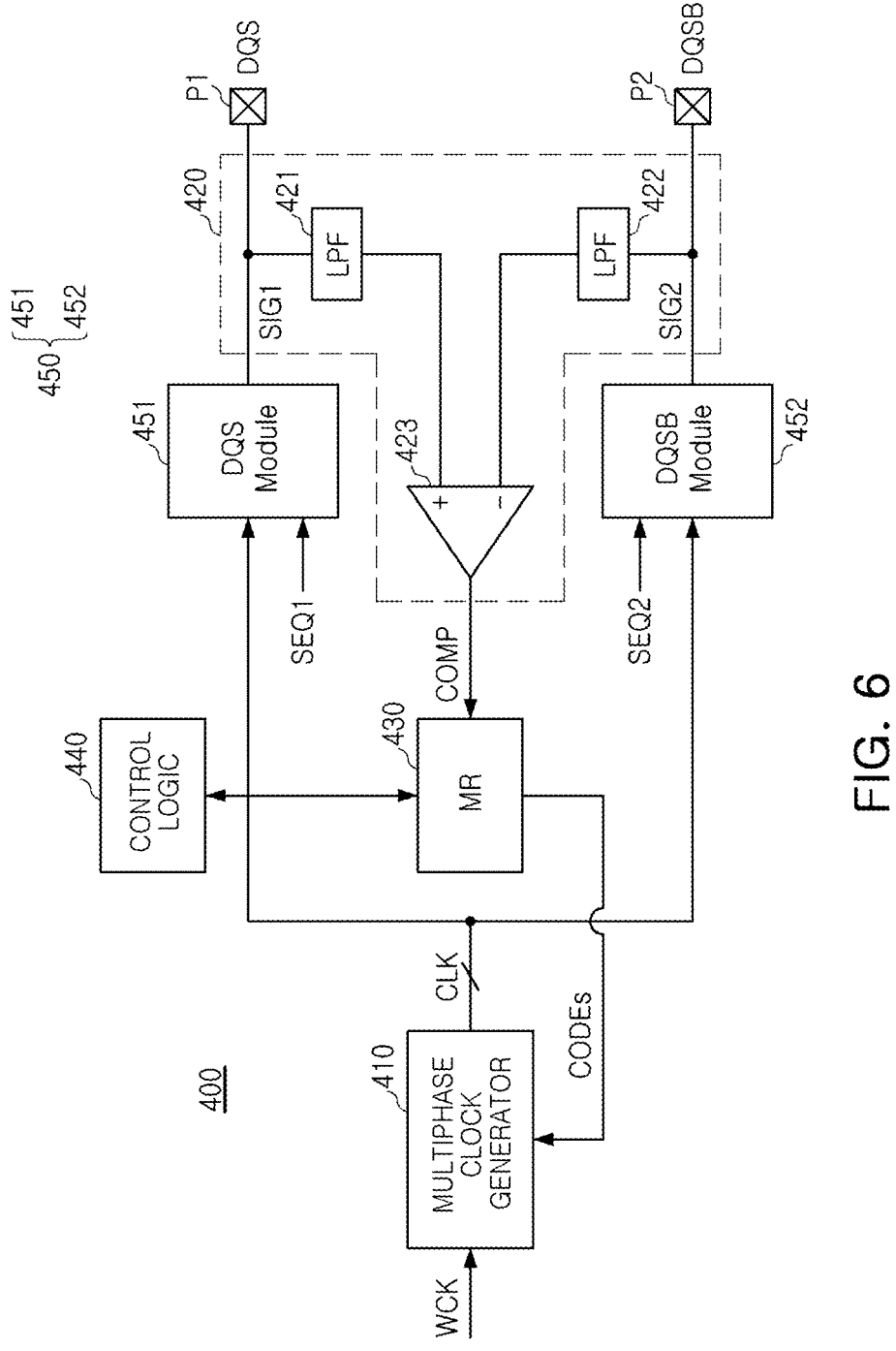
FIG. 6 is a diagram illustrating a multiphase clock corrector according to an example embodiment of the present disclosure.

FIG. 6 is a diagram illustrating a multiphase clock corrector according to an example embodiment.

Referring to FIG. 6, the multiphase clock corrector 400 may include a multiphase clock generator 410, a phase error detector 420, a mode register 430, a control logic 440 (i.e., a control circuit) and a clock generation circuit 450.

The multiphase clock generator 410 and the clock generation circuit 450 in FIG. 6 may correspond to the multiphase clock generator 261 and the clock generation circuit 262 described with reference to FIG. 5.

The clock generation circuit 450 may output a data strobe signal DQS and a complementary data strobe signal DQSB by sampling a parallelized data sequence using the multiphase clock CLK.

The clock generation circuit 450 may include a data strobe module 451 (i.e., a first serializer) connected to the first pin P1 to output the data strobe signal DQS, and a complementary data strobe module 452 (i.e., a second serializer) connected to the second pin P2 to output the complementary data strobe signal DQSB.

When a phase correction of the multiphase clock CLK is not being performed, the data strobe module 451 may output the data strobe signal DQS to the first pin P1 in response to the multiphase clock CLK, and the complementary data strobe module may 452 output the complementary data strobe signal DQSB to the second pin P2 in response to the multiphase clock CLK. For example, the data strobe module 451 may toggle the data strobe signal DQS in response to a plurality of clock signals included in the multiphase clock CLK. If there is a phase error in the multiphase clock CLK, a duty ratio of the data strobe signals DQS might not be 50%.

In an example embodiment, when the phase correction is being performed, the data strobe module 451 may additionally receive a first data sequence SEQ1, and output a first serial signal SIG1 to the first pin P1 based on the first data sequence SEQ1 and the multiphase clock CLK. The complementary data strobe module 452 may additionally receive a second data sequence SEQ2, and output a second serial signal SIG2 to the second pin P2 based on the second data sequence SEQ2 and the multiphase clock CLK. For example, each of the first data sequence SEQ1 and the second data sequence SEQ2 may include parallelized signals. The data strobe module 451 and the complementary data strobe module 452 may serialize the first data sequence SEQ1 and the second data sequence SEQ2 based on the multiphase clock CLK, and output the first serial signal SIG1 and the second serial signal SIG2, similarly to the data signal module DQM described in FIG. 3A.

The first serial signal SIG1 itself might not be the data strobe signal DQS and the second serial signal SIG2 itself might not be the complementary data strobe signal DQSB. The first serial signal SIG1 and the second serial signal SIG2 may be used to correct a phase error of the multiphase clock CLK. When the phase correction is completed, the data strobe module 451 may output a data strobe signal DQS having a duty ratio of 50% in response to the multiphase clock CLK, and the complementary data strobe module 452 may output a complementary data strobe signal DQSB having a duty ratio 50% in response to the multiphase clock CLK.

In an example embodiment, the control logic 440 may control such that a first data sequence SEQ1 may be input to the data strobe module 451 and a second data sequence SEQ2 may be input to the complementary data strobe module 452 to detect a phase error of the multiphase clock. In an embodiment, the mode register 430 may store the first and second data sequences SEQ1 and SEQ2, The data strobe module 451 may generate a first serial signal SIG1 by sampling the first data sequence SEQ1 in response to the multiphase clock CLK, and may output the first serial signal SIG1 through the first pin P1. The complementary data strobe module 452 may generate a second serial signal SIG2 by sampling the second data sequence SEQ2 in response to the multiphase clock CLK, and may output the second serial signal SIG2 through the second pin P2.

The data strobe signal DQS and the complementary data strobe signal DQSB, which may be output together when the data signal DQ is output, may have a complementary relationship. For example, in a rising period of the data strobe signal DQS, the complementary data strobe signal DQSB may have a falling period, and in a falling period of the data strobe signal DQS, the complementary data strobe signal DQSB may have a rising period.

However, when correcting of a phase of a multiphase clock is performed, the first serial signal SIG1 and the second serial signal SIG2 output by the clock generation circuit 450 may not necessarily have a complementary relationship. The first serial signal SIG1 and the second serial signal SIG2 may be determined based on the first and second data sequences SEQ1 and SEQ2.

For example, each of the first and second data sequences SEQ1 and SEQ2 may have an identical length, the first serial signal SIG1 may be determined to have a rising period between a rising edge of the reference clock signal and a rising edge of the target clock signal, and the second serial signal SIG2 may be determined to have a rising period between a rising edge of the target clock signal and a rising edge of the reference clock signal. The target clock signal may refer to a clock signal of which a phase is to be measured among the plurality of clock signals, and the reference clock signal may refer to a clock signal which may be a criterion for measuring a phase of the target clock signal. For example, a phase of the target clock signal may be measured with reference to the reference clock signal. In an embodiment, one of the plurality of clock signals CLKI, CLKQ, CLKIB, and CLKQB of the multiphase clock CLK may serve as the reference clock signal, and the others are target clock signals.

The phase error detector 420 may compare lengths of rising periods of the first serial signal SIG1 and the second serial signal SIG2 received from the clock generation circuit 450, and may output the comparison result COMP to the mode register MR.

The phase error detector 420 may include a first low-pass filter 421, a second low-pass filter 422 and a comparator 423. The first low-pass filter 421 may output a direct current level of the first serial signal SIG1, and the second low-pass filter 422 may output a direct current level of the second serial signal SIG2. The direct current levels of the first serial signal SIG1 and the second serial signal SIG2 may be proportional to the lengths of the rising periods of the first serial signal SIG1 and the second serial signal SIG2, respectively.

The comparator 423 may output a comparison result COMP by comparing the direct current level output by the first low-pass filter 421 and the direct current level output by the second low-pass filter 422. In an example embodiment, a chopper comparator may be used as the comparator 423 outputting the comparison result COMP. An offset such as the offset voltage of voltages inputted to the comparator 423 is removed or reduced.

The mode register 430 may store the comparison result COMP output by the phase error detector 420. The control logic 440 may correct a phase of the target clock signal by obtaining the comparison result COMP from the mode register 430 and changing a value of the control code set CODE stored in the mode register 430 based on the comparison result COMP.

In the description below, a method of detecting and correcting a phase error according to an example embodiment will be described with reference to FIGS. 7 to 9B, and a circuit structure of the phase error detector 420 will be described in greater detail with reference to FIG. 10.

Figure 7:
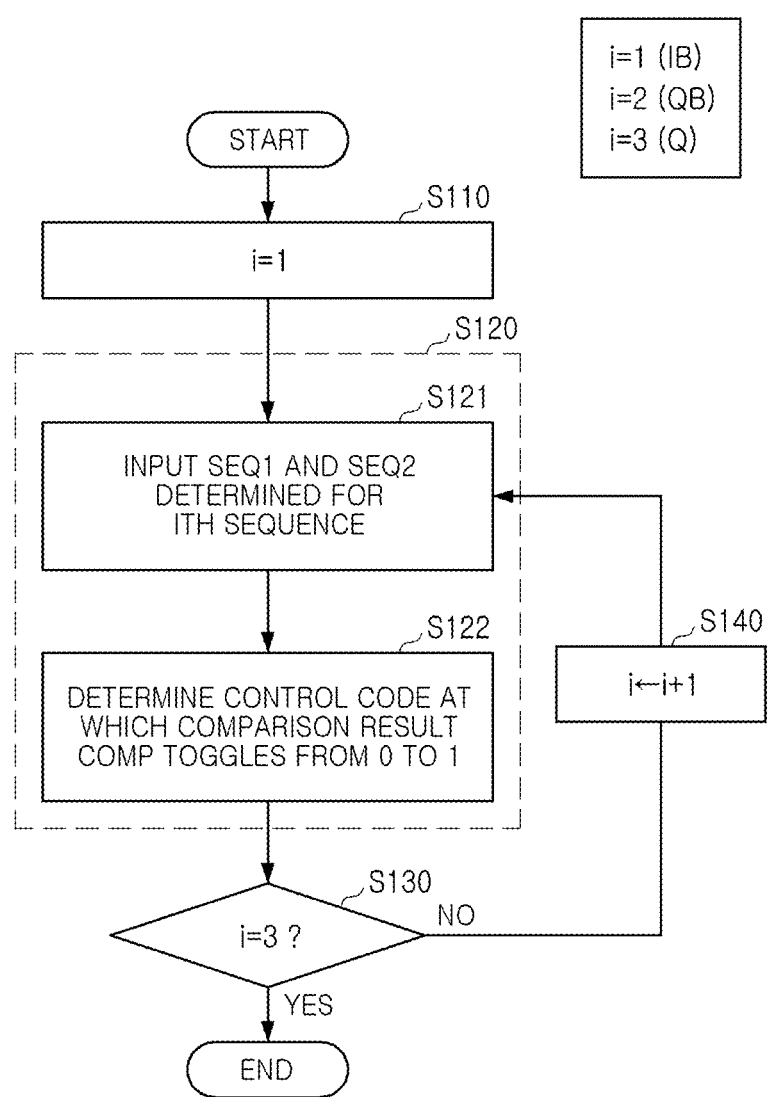
FIG. 7 is a flowchart illustrating a method of detecting and correcting a phase error corrector according to an example embodiment of the present disclosure.

FIG. 7 is a flowchart illustrating a method of detecting and correcting a phase error corrector according to an example embodiment.

Referring to FIG. 7, the method of detecting and correcting a phase error according to an example embodiment may include operation S110 to operation S140. Specifically, among a plurality of clock signals CLKI, CLKQ, CLKIB, and CLKQB included in a multiphase clock, detecting and correcting a phase error may be performed in sequence for each of the other clock signals CLKQ, CLKIB, and CLKQB other than the first clock signal CLKI, which is a reference clock signal. In an example embodiment, the detecting and correcting a phase error may be performed according to the sequence of the third clock signal CLKIB, the fourth clock signal CLKQB and the second clock signal CLKQ.

In operation S110, the control logic 440 may initialize the sequence of the detecting and correcting a phase error to 'i=1'. In operation S120, the control logic 440 may detect and correct a phase error for the third clock signal CLKIB. Operation S120 may include operation S121 and operation S122.

In operation S121, the control logic 440 may input the first and second data sequences SEQ1 and SEQ2 determined for the ith sequence to the data strobe module 451 and the complementary data strobe module 452 through the mode register 430. For example, the control logic 440 may control the mode register 430 to provide the data strobe module 451 and the complementary data strobe module 452 with the first and second data sequences SEQ1 and SEQ2.

The first and second serial signals SIG1 and SIG2 may be input to the phase error detector 420, and the comparison result COMP may be output according to the comparison result of lengths of rising periods of the first and second serial signals SIG1 and SIG2. For example, the comparison result COMP may have a logic low level when the phase of the rising edge of the target clock signal is less than an ideal phase, and may have a logic high level when the phase of the rising edge of the target clock signal is greater than the ideal phase. In an embodiment, at the ideal phase of each target clock signal, phase intervals of two adjacent clock signals of the plurality of clock signals CLKI, CLKQ, CLKIB, and CLKQB may be equal with each other.

In operation S122, the control circuit 440 may determine a control code of the time point at which the comparison result COMP toggles from "0" to "1", or from "1" to "0".

Specifically, the control code set CODE may include first to third control codes for controlling phases of the second to fourth clock signals CLKQ, CLKIB, and CLKQB, respectively.

The control circuit 440 may perform a linear search for increasing a value of a control code corresponding to a target clock signal by "1" from the lowest value, and may determine a value of the control code at the time point at which the comparison result COMP toggles from "0" to "1" as a value of the control code of the target clock signal.

In operation S130, the control circuit 440 may determine whether phase correction for the clock signal of the last sequence (i=3) has been completed.

When the phase correction for the clock signal of the last sequence is not completed (in operation S130, "No"), the control circuit 440 may move to the subsequent sequence (i←i+1) in operation S140, and detecting and correcting a phase in operation S120 may be performed on the clock signal of the subsequent sequence.

When phase correction for the clock signal of the last sequence is completed ("Yes" in operation S130), the control circuit 440 may end the detecting and correcting a phase.

In the description below, examples of first and second data sequences SEQ1 and SEQ2 and serial signals SIG1 and SIG2 for each of a third clock signal CLKIB, an orthogonal phase clock signal CLKQB and an inverted second clock signal CLKQ will be described in greater detail with reference to FIGS. 8, 9A and 9B.

Figure 8:
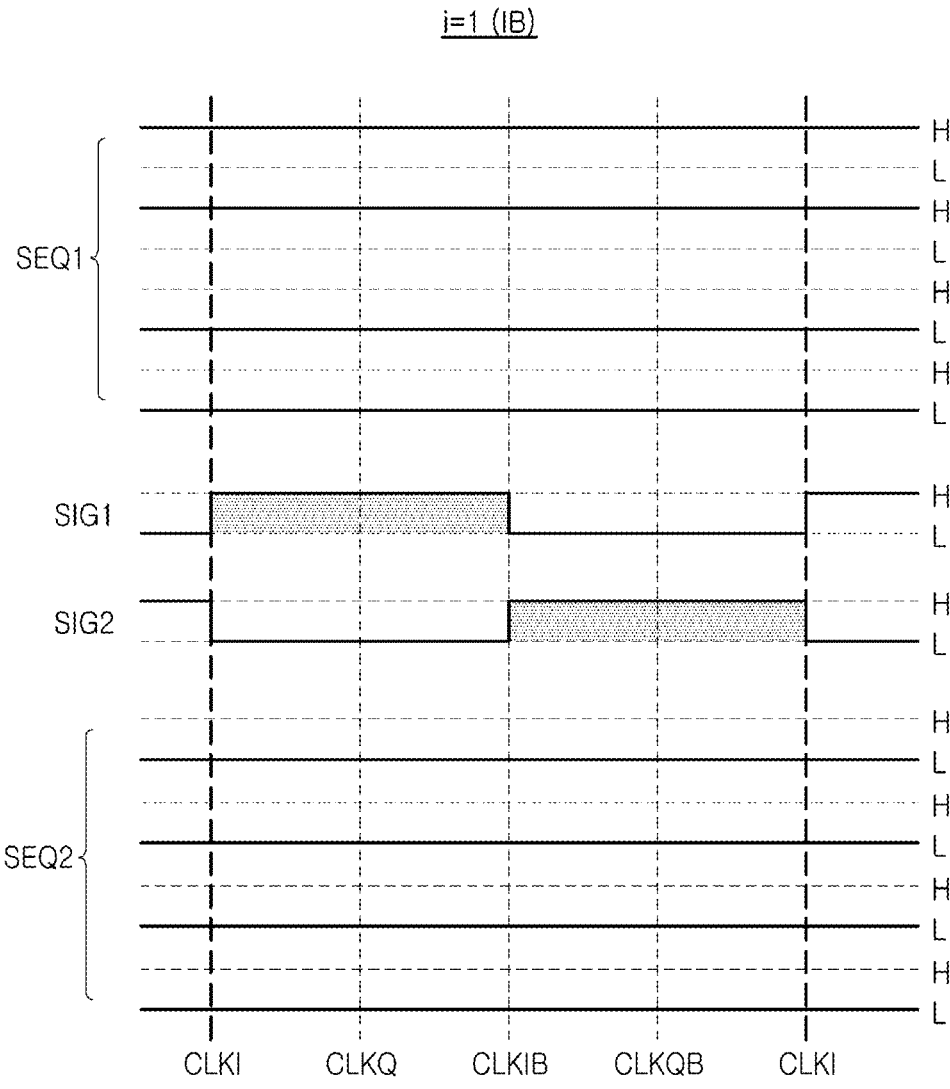
FIGS. 8, 9A and 9B are diagrams illustrating a method of detecting a phase error according to an example embodiment of the present disclosure.
Figures 9A, 9B:
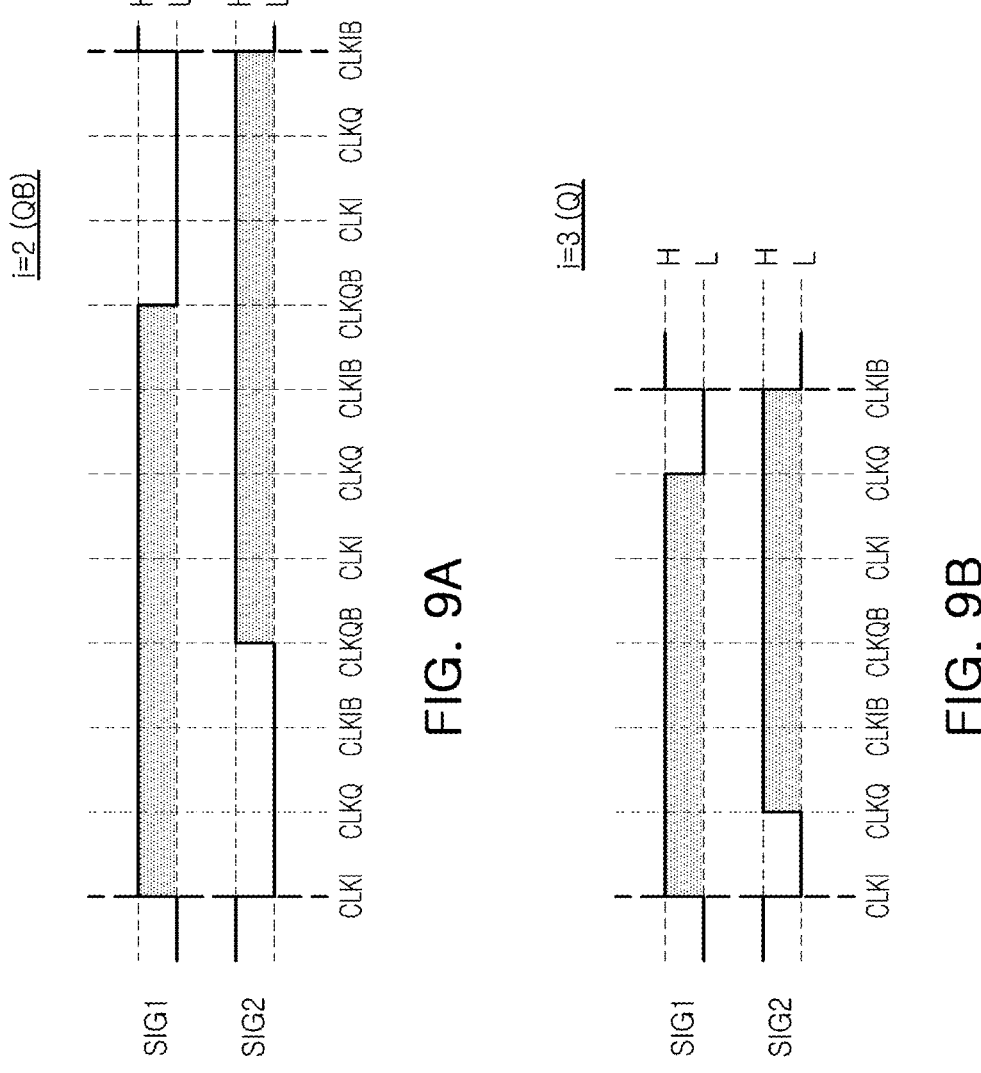

FIGS. 8, 9A and 9B are diagrams illustrating a method of detecting a phase error according to an example embodiment.

FIG. 8 illustrates first parallelized signals included in the first data sequence SEQ1 input to the data strobe module 451, and the first serial signal SIG1 which is a serialized signal output by the data strobe module 451 based on the first parallelized signals.

Second parallelized signals included in the second data sequence SEQ2 input to a complementary data strobe module 452, and the second serial signal SIG2 which is a serialized signal output by the complementary data strobe module 452 based on the second parallelized signals are illustrated.

To perform an operation of detecting and correcting a phase error for the third clock signal CLKIB based on the first clock signal CLKI, "1100" may be repeatedly input to the data strobe module 451 as the first data sequence SEQ1, and a complementary data strobe "0011" may be repeatedly input to the complementary data strobe module 452 as the second data sequence SEQ2.

The first data sequence SEQ1 may be parallelized into the first parallelized signals, and the first parallelized signals may be input to the data strobe module 451. For example, to repeatedly input the first data sequence SEQ1 "1100," signals of a logic high level H, a logic high level H, a logic low level L and a logic low level L may be continuously input to the data strobe module 451 as the first parallelized signals.

The data strobe module 451 may generate the first serial signal SIG1 by sequentially sampling the first parallelized signals using the plurality of clock signals CLKI, CLKQ, CLKIB, and CLKQB. When the first data sequence SEQ1 has a value of "1100," the first serial signal SIG1 may have a rising period between a rising edge of the first clock signal CLKI and a rising edge of the third clock signal CLKIB occurring after the rising edge. The first serial signal SIG1 may have a falling period between a rising edge of the third clock signal CLKIB and a rising edge of the first clock signal CLKI occurring after the rising edge.

The second data sequence SEQ2 may be parallelized into the second parallelized signals, and the second parallelized signals may be input to the complementary data strobe module 452. Based on the second data sequence SEQ2 "0011," signals of a logic low level L, a logic low level L, a logic high level H and a logic high level H may be input in sequence as the second parallelized signals.

The complementary data strobe module 452 may generate the second serial signal SIG2 by sequentially sampling the second parallelized signals using the plurality of clock signals CLKI, CLKQ, CLKIB, and CLKQB. When the second data sequence SEQ2 has the value "0011," the second serial signal SIG2 may have a falling period between a rising edge of the first clock signal CLKI and a rising edge of the third clock signal CLKIB occurring after the rising edge. The second serial signal SIG2 may have a rising period between a rising edge of the third clock signal CLKIB and a rising edge of the first clock signal CLKI occurring after the rising edge.

When the third clock signal CLKIB has a phase exactly inverted with the first clock signal CLKI ideally, the rising period of the first serial signal SIG1 and the rising period of the second serial signal SIG2 may have exactly identical lengths. When the phase of the third clock signal CLKIB is earlier than the ideal phase, the rising period of the first serial signal SIG1 may be shorter than the rising period of the second serial signal SIG2, and when the phase of the third clock signal CLKIB is later than the ideal phase, the rising period of the first serial signal SIG1 may be longer than the rising period of the second serial signal SIG2. The rising period of signal SIG1 may be longer than the rising period of the second serial signal SIG2.

In an example embodiment, the control circuit 440 may perform a linear search for the second control code to control the phase of the third clock signal CLKIB, and may search for a value of the second control code at which the lengths of the rising period of the first serial signal SIG1 and the rising period of the second serial signal SIG2 become identical.

When correcting the phase of the third clock signal CLKIB is completed, the phases of the fourth clock signal CLKQB and the second clock signal CLKQ may be adjusted based on the first clock signal CLKI and third clock signal CLKIB, respectively.

In the example in FIG. 9A, to perform an operation of detecting and correcting a phase error for the fourth clock signal CLKQB based on the first clock signal CLKI and the third clock signal CLKIB, "1111111000" may be repeatedly input to the data strobe module 451 as the first data sequence SEQ1. "0001111111" may be repeatedly input to the complementary data strobe module 452 as the second data sequence SEQ2.

FIG. 9A illustrates a first serial signal SIG1 and a second serial signal SIG2 generated by sampling the first data sequence SEQ1 and the second data sequence SEQ2 by the data strobe module 451 and the complementary data strobe module 452 using the plurality of clock signals CLKI, CLKQ, CLKIB, and CLKQB.

When the first data sequence SEQ1 has the value "1111111000," the first serial signal SIG1 may have a rising period between a rising edge of the first clock signal CLKI and a rising edge of the fourth clock signal CLKQB occurring after the rising edge. The first serial signal SIG1 may have a falling period between a rising edge of the fourth clock signal CLKQB and a rising edge of the third clock signal CLKIB occurring after the rising edge.

When the second data sequence SEQ2 has the value "0001111111," the second serial signal SIG2 may have a falling period between a rising edge of the first clock signal CLKI and a rising edge of the fourth clock signal CLKQB occurring after the rising edge. The second serial signal SIG2 may have a rising period between a rising edge of the fourth clock signal CLKQB and a rising edge of the third clock signal CLKIB occurring after the rising edge.

When the fourth clock signal CLKQB has a 270° phase difference with the first clock signal CLKI ideally, the rising period of the first serial signal SIG1 and the rising period of the second serial signal SIG2 may have exactly identical lengths. However, when the phase of the fourth clock signal CLKQB is misaligned with a target phase, the lengths of the rising period of the first serial signal SIG1 and the rising period of the second serial signal SIG2 may be different.

In an example embodiment, the control circuit 440 may perform a linear search for the third control code to control the phase of the fourth clock signal CLKQB, and may search for the value of the third control code at which the length of the rising period of the first serial signal SIG1 and the rising period of the second serial signal SIG2 become identical.

In the example in FIG. 9B, to perform an operation of detecting and correcting a phase error for the second clock signal CLKQ based on the first clock signal CLKI and the third clock signal CLKIB, "111110" may be repeatedly to the data strobe module 451 input as the first data sequence SEQ1. "011111" may be repeatedly input to the complementary data strobe module 452 as the second data sequence SEQ2.

When the first data sequence SEQ1 has the value "111110," the first serial signal SIG1 may have a rising period between a rising edge of the first clock signal CLKI and a rising edge of the second clock signal CLKQ occurring after the rising edge. The first serial signal SIG1 may have a falling period between a rising edge of the orthogonal phase clock signal CLKQB and a rising edge of the third clock signal CLKIB occurring after the rising edge.

When the second data sequence SEQ2 has the value "011111," the second serial signal SIG2 may have a falling period between a rising edge of the first clock signal CLKI and a rising edge of the second clock signal CLKQ occurring after the rising edge. The second serial signal SIG2 may have a rising period between a rising edge of the second clock signal CLKQ and a rising edge of the third clock signal CLKIB occurring after the rising edge.

When the second clock signal CLKQ has a 90° phase difference with the first clock signal CLKI ideally, a rising period of the first serial signal SIG1 and a rising period of the second serial signal SIG2 may have exactly identical lengths. However, when a phase of the fourth clock signal CLKQB is misaligned with a target phase, lengths of the rising period of the first serial signal SIG1 and the rising period of the second serial signal SIG2 may be different.

In an example embodiment, the control circuit 440 may perform a linear search for the first control code to control the phase of the fourth clock signal CLKQB, and may search for a value of the first control code at which the lengths of the rising period of the first serial signal SIG1 and the rising period of the second serial signal SIG2 become identical.

The first and second data sequences SEQ1 and SEQ2 for correcting a phase of each of the second to fourth clock signals CLKQ, CLKIB, and CLKQB are not limited to the examples in FIGS. 8, 9A and 9B.

For example, the first and second data sequences SEQ1 and SEQ2 may have identical lengths and may be selected from various data sequences having identical lengths of logic high levels. The first data sequence SEQ1 may be selected as a data sequence in which the first serial signal SIG1 may have a rising period between a rising edge of a reference clock signal and a rising edge of a target clock signal occurring after the rising edge. The second data sequence may be selected as a data sequence in which the second serial signal SIG2 may have a rising period between a rising edge of the target clock signal and a rising edge of the reference clock signal occurring after the rising edge. For example, the first and second data sequences SEQ1 and SEQ2 for correcting a phase of the third clock signal CLKIB may have values of "111111000000" and "000000111111," respectively.

The phase error detector 420 may include a comparator 423. In order for the comparator 423 to output an accurate comparison result COMP, the comparator 423 may include a chopper comparator which may remove an offset from the comparison result COMP.

In the description below, a circuit structure of the phase error detector 420 including a chopper comparator will be described in greater detail according to an example embodiment with reference to FIG. 10.

Figure 10:
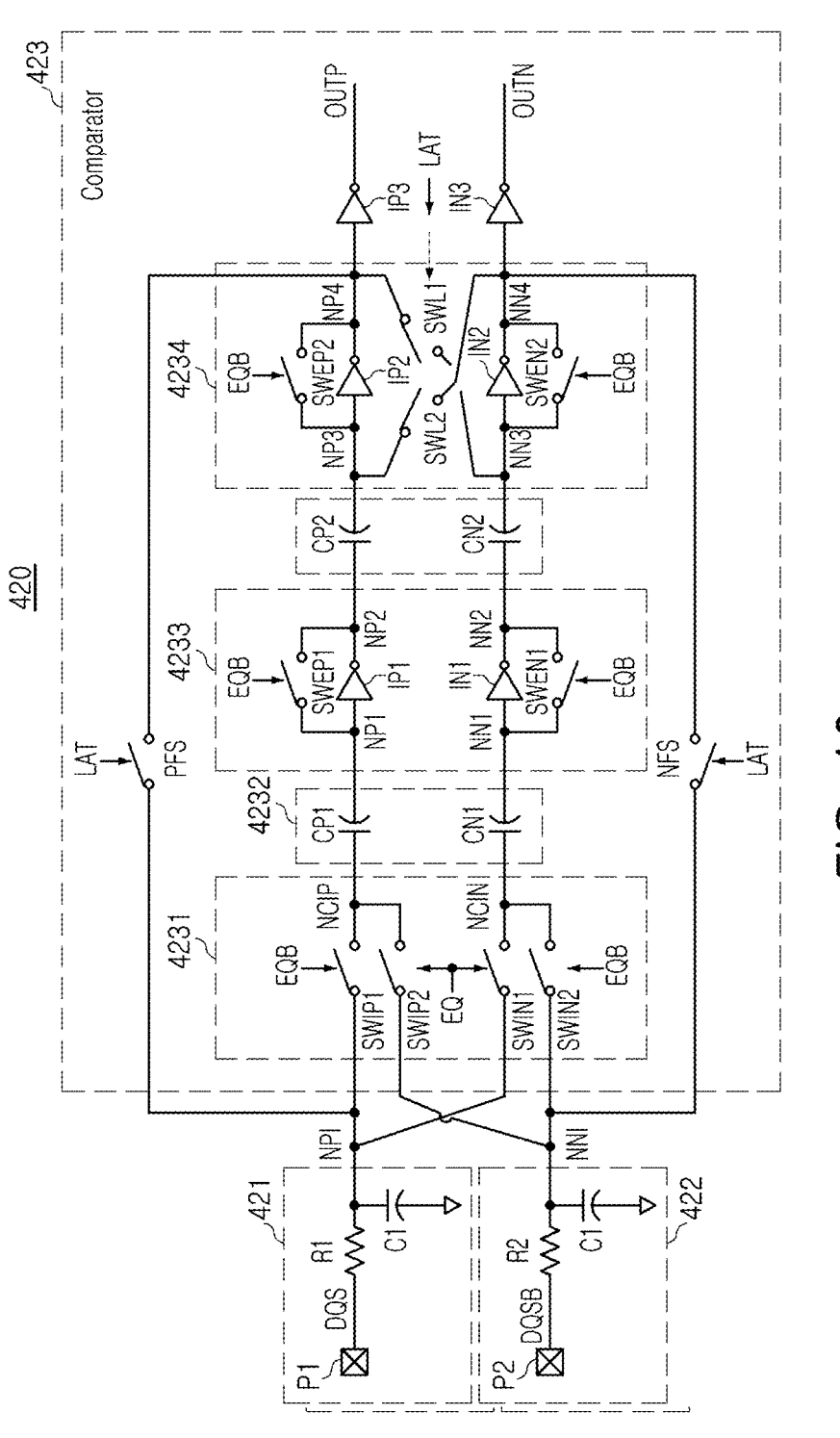
FIG. 10 is a diagram illustrating a circuit structure of a phase error detector according to an example embodiment of the present disclosure.

FIG. 10 is a diagram illustrating a circuit structure of a phase error detector according to an example embodiment.

As described with reference to FIG. 6, the phase error detector 420 may include a first low-pass filter 421, a second low-pass filter 422 and a comparator 423. The comparator 423 may have a differential structure.

Referring to FIG. 10, each of the first low-pass filter 421 and the second low-pass filter 422 may include an RC circuit. Specifically, the first low-pass filter 421 may include a first resistor R1 connected between a first pin P1 configured to output a data strobe signal DQS and a positive input node NPI of the comparator 423, and a first capacitor C1 connected between the positive input node NPI and the ground.

The second low-pass filter 422 may include a second resistor R2 connected between a second pin P2 configured to output a complementary data strobe signal DQSB and a negative input node NNI of the comparator 423, and a second capacitor C2 connected between the negative input node NNI and the ground.

The first low-pass filter 421 may output a direct current level of the first serial signal SIG1 which periodically repeats a rising period and a falling period, and the second low-pass filter 422 may output a direct current level of the second serial signal SIG2, which periodically repeats a rising period and a falling period. The direct current levels may correspond to lengths of the rising periods of the serial signals.

The comparator 423 may include an input circuit 4231, a first coupling circuit 4232, a first inverted amplifier circuit 4233, a second coupling circuit 4234 and a second inverted amplifier circuit 4235.

The input circuit 4231 may alternately select one of a positive input voltage of the positive input node NPI and a negative input voltage of the negative input node NNI in an equalization period and a sampling period, and may generate an amplified input signal through a sampling node.

Specifically, the input circuit 4231 may include a first positive input switch SWIP1, a second positive input switch SWIP2, a first negative input switch SWIN1 and a second negative switch SWIN2.

The first positive input switch SWIP1 may electrically connect the positive input node NPI to a positive sampling node NCIP to output a positive amplified input signal based on an inverted equalization signal EQB having an activation period corresponding to the sampling period. The second positive input switch SWIP2 may electrically connect the negative input node NNI to the positive sampling node NCIP to output a negative amplified input signal based on an equalization signal EQ corresponding to the equalization period.

The first negative input switch SWIN1 may electrically connect the positive input node NPI to the negative sampling node NCIN based on the equalization signal EQ. The second negative input switch SWIN2 may electrically connect the negative input node NNI to the negative sampling node NCIN based on the inverted equalization signal EQB.

The first coupling circuit 4232 may include a first positive coupling capacitor CP1 and a first negative coupling capacitor CN1. The first positive coupling capacitor CP1 may be connected between the positive sampling node NCIP and a first positive node NP1. The first negative coupling capacitor CN1 may be connected between the negative sampling node NCIN and a first negative node NN1.

The first inverted amplifier circuit 4233 may include a first positive inverter IP1, a first negative inverter IN1, a first positive equalization switch SWEP1 and a first negative equalization switch SWEN1. The first inverted amplifier circuit 4233 may include the first positive node NP1 and the first negative node NN1 as input nodes, and may include a second positive node NP2 and a second negative node NN2 as output nodes.

The first positive inverter IP1 may be connected between the first positive node NP1 and the second positive node NP2. The first negative inverter IN1 may be connected between the first negative node NP1 and the second negative node NN2.

The first positive equalization switch SWEP1 may electrically connect the first positive node NP1 to the second positive node NP2 based on the inverted equalization signal EQB. The first negative equalization switch SWEN1 may electrically connect the first negative node NN1 to the second negative node NN2 based on the inverted equalization signal EQB.

The second coupling circuit 4234 may include a second positive coupling capacitor CP2 and a second negative coupling capacitor CN2. The second positive coupling capacitor CP2 may be connected between the second positive node NP2 and a third positive node NP3. The second negative coupling capacitor CN2 may be connected between the second negative node NN2 and a third negative node NN3.

The second inverted amplifier circuit 4235 may include a second positive inverter IP2, a second negative inverter IN2, a second positive equalization switch SWEP2 and a second negative equalization switch SWEN2. The second inverted amplifier circuit 4235 may include the third positive node NP3 and the third negative node NN3 as input nodes, and may include a fourth positive node NP4 and a fourth negative node NN4 as output nodes.

The second positive inverter IP2 may be connected between the third positive node NP3 and the fourth positive node NP4. The second negative inverter IN2 may be connected between the third negative node NP3 and the fourth negative node NN4.

The second positive equalization switch SWEP2 may electrically connect the third positive node NP3 to the fourth positive node NP4 based on the inverted equalization signal EQB. The second negative equalization switch SWEN2 may electrically connect the third negative node NN3 to the fourth negative node NN4 based on the inverted equalization signal EQB.

In an example embodiment, the second inverted amplifier circuit 4235 may further include a first latching switch SWL1 and a second latching switch SWL2.

The first latching switch SWL1 may electrically connect the fourth positive node NP4 to the third negative node NN3 based on a latch signal LAT activated in a sampling period. The second latching switch SWL2 may electrically connect the third positive node NP3 to the fourth negative node NN4 based on the latch signal LAT. Consequently, in the activation period of the latch signal LAT, the second positive inverter IP2 and the second negative inverter IN2 may form a latch.

In an example embodiment, the comparator 423 may further include a third positive inverter IP3 and a third negative inverter IN3.

The third positive inverter IP3 may be connected to the fourth positive node NP4, and may generate a positive output signal OUTP by inverting and amplifying the positive comparison result signal output to the fourth positive node NP4. The third negative inverter IN3 may be connected to the fourth negative node NN4, and a negative output signal OUTN may be generated by inverted-amplifying the negative comparison result signal output to the fourth negative node NN4. The positive output signal OUTP and the negative output signal OUTN may correspond to a differential output of the comparison result COMP in FIG. 6. For example, the positive output signal OUTP and the negative output signal OUTN may form a differential output signal.

In an example embodiment, the comparator 423 may further include a positive feedback switch PFS configured to electrically connect the fourth positive node NP4 to the first positive node NP1 based on the latch signal LAT, and a negative feedback switch NFS configured to electrically connect the fourth negative node NN4 to the first negative node NN1 based on the latch signal LAT.

The comparator 423 described with reference to FIG. 10 may effectively remove an offset and may operate with low power by performing a multi-step amplification operation and equalization operation.

In an example embodiment described with reference to FIGS. 6 to 10, the control logic 440 may control generation of the first serial signal SIG1 and the second serial signal SIG2, and may correct a phase interval of the multiphase clock by performing a search for a control code set based on the comparison result COMP generated by the phase error detector 420. In example embodiments, the control logic 440 may be included in the control logic circuit 210 described with reference to FIG. 5 or may be included in a memory controller provided externally of the memory device 200.

Since it may be sufficient for the phase error detector 420 to output a comparison result of the lengths of the rising period of the first serial signal SIG1 and the second serial signal SIG2, the phase error detector 420 may have a simplified circuit structure including low-pass filters 421, 422 and a comparator 423.

In an example embodiment, the phase error detector 420 may be included in the memory device 200 and may hardly increase a circuit area and power consumption of the memory device 200. For example, the simplified circuit of the phase error detector 420 may have less circuit area and power consumption. Accordingly, the multiphase clock corrector 400 may detect and correct a phase error of the multiphase clock based on a signal measured in the memory device 200 while reducing power consumption, thereby improving speed and accuracy of the detecting and correcting operations.

In the description below, a multiphase clock corrector and method of correcting a multiphase clock based on a multiphase clock CLK will be described in greater detail according to an example embodiment with reference to FIGS. 11 to 13.

Figure 11:
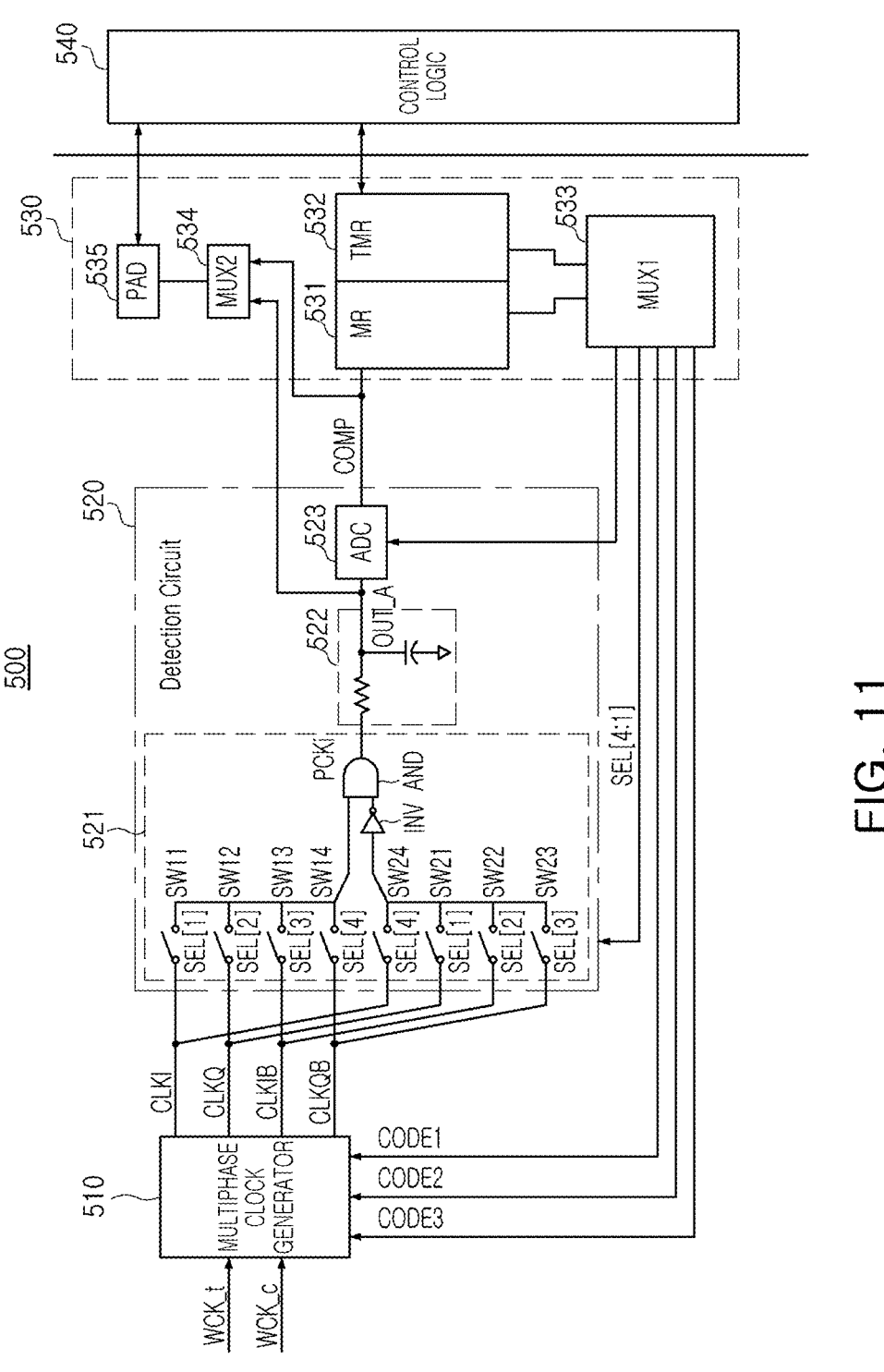
FIG. 11 is a diagram illustrating a multiphase clock corrector according to an example embodiment of the present disclosure.

FIG. 11 is a diagram illustrating a multiphase clock corrector according to an example embodiment.

Referring to FIG. 11, a multiphase clock corrector 500 may include a multiphase clock generator 510, a phase error detector 520, an interface circuit 530 and a control logic 540 (i.e., control logic).

The multiphase clock generator 510 may correspond to the multiphase clock generator 261 described with reference to FIG. 5.

The multiphase clock generator 510 may output a plurality of clock signals CLKI, CLKQ, CLKIB, and CLKQB based on differential data clock signals WCK_t and WCK_c.

The phase error detector 520 may generate a pulse clock signal PCLKi using the plurality of clock signals CLKI, CLKQ, CLKIB, and CLKQB, may measure a direct current level OUT_A corresponding to a length of a rising period of the pulse clock signal PCLKi, and may output the comparison result COMP obtained by comparing the direct current level OUT_A with a reference level corresponding to a digital code value to the interface circuit 530.

The interface circuit 530 may support data exchange between the control logic 540, the multiphase clock generator 510 and the phase error detector 520. For example, the interface circuit 530 may include a mode register 531, which may be accessed by the control logic 540.

The control logic 540 may control the multiphase clock generator 510 and the phase error detector 520 through the interface circuit 530. Specifically, the control logic 540 may obtain the comparison result COMP detected using the phase error detector 520 from the mode register 531, may determine phases of the plurality of clock signals CLKQ, CLKIB, and CLKQB based on the comparison result COMP, and may determine values of the control codes CODE1, CODE2, and CODE3 included in the control code set. The control logic 540 may control a phase of the multiphase clock generator 510 by storing determined values of the control codes in the mode register 531.

The phase error detector 520 may include a select circuit 521, a low-pass filter 522 and an analog to digital converter (ADC) 523.

The select circuit 521 may select adjacent clock signals from among the plurality of clock signals CLKI, CLKQ, CLKIB, and CLKQB in response to select signals SEL[4:1], and may output a signal having a rising period between rising edges of adjacent clock signals.

Specifically, the select circuit 521 may include a plurality of switches SW11-SW24 (SW11, SW12, SW13, SW14, SW21, SW22, SW23, and SW24), an inverter circuit INV and an AND gate AND.

The first clock signal CLKI may be input to one of two inputs of the AND gate AND in response to the first select signal SEL[1] among the select signals SEL[4:1], and the second clock signal CLKQ may be input to the other as a signal inverted by the inverter circuit INV. Consequently, the first pulse clock signal PCLK1 having a rising period between a rising edge of the first clock signal CLKI and a rising edge of the second clock signal CLKQ may be output by the select circuit 521 in response to the first select signal SEL[1].

Similarly, a second pulse clock signal PCLK2 as described with reference to FIG. 2 may be output by the select circuit 521 in response to the second select signal SEL[2]. A third pulse clock signal PCLK3 as described with reference to FIG. 2 may be output by the select circuit 521 in response to the third select signal SEL[3]. A fourth pulse clock signal PCLK4 as described with reference to FIG. 2 may be output by the select circuit 521 in response to the fourth select signal SEL[4].

The low-pass filter 522 may output a direct current level OUT_A having a value proportional to a length of a rising period of the pulse clock signal PCLKi output by the select circuit 521. The ADC 523 may output a comparison result COMP obtained by comparing the direct current level OUT_A and a reference level corresponding to a digital code value to the interface circuit 530.

The mode register 531 included in the interface circuit 530 may store data necessary for control of the multiphase clock generator 510 and the phase error detector 520. For example, the mode register 531 may store the comparison result COMP, the select signal SEL[4:1] and the control code set. When the control logic 540 is included in a memory controller provided externally of the memory device, the control logic 540 may access the mode register 531 using the mode register read MRR command and the mode register write MRW command in a normal mode of the memory device. In the normal mode, the memory device may perform a read operation or a write operation under the control of a memory controller.

In an example embodiment, the interface circuit 530 may further include a test mode register 532 and a first multiplexer 533.

The test mode register 532 may store data necessary for control of the multiphase clock generator 510 and the phase error detector 520 in a test mode of the memory device. When the control logic 540 is included in a memory controller externally of the memory device, the control logic 540 may access the test mode register 532 in the test mode using a test mode register set TMRS command. In the test mode of a memory device, an operation is performed to verify the memory's functionality, reliability, and performance or to check manufacturing defects, ensure data integrity, validate timing parameters, and confirm overall device behavior under various conditions.

The first multiplexer 533 may select one of an output signal of the mode register 531 and an output signal of the test mode register 532 and may output the signal to the multiphase clock generator 510 and the phase error detector 520. The control circuit 540 may perform an operation of detecting and correcting of a phase according to an example embodiment in any of the normal mode and the test mode.

In an example embodiment, the interface circuit 530 may further include a second multiplexer 534 and a signal pad 535.

The signal pad 535 may provide a signal output by the phase error detector 520 to the control logic 540 without going through the mode register 531. The second multiplexer 534 may provide one of the direct current level OUT_A and the comparison result COMP output by the phase error detector 520 to the signal pad 535.

The control logic 540 may perform an operation of detecting and correcting a phase error of the plurality of clock signals CLKI, CLKQ, CLKIB, and CLKQB using the comparison result COMP obtained from the interface circuit 530, and may output the control code set.

For example, the control logic 540 may determine digital code values (i.e., corresponding code values) corresponding to lengths of rise periods of the entirety of the pulse clock signals PCLK1, PCLK2, PCLK3, and PCLK4 generated by the plurality of clock signals CLKI, CLKQ, CLKIB, and CLKQB using the comparison result COMP, and may determine a reference value based on the digital code values.

The control logic 540 may determine control codes CODE1, CODE2, and CODE3 in which each of the digital code values of the pulse clock signals PCLK1, PCLK2, PCLK3, and PCLK4 may have a reference value, and may input the control code set including the determined control codes CODE1, CODE2, and CODE3 to mode register 531, thereby correcting the phase of the multiphase clock.

Figure 12:
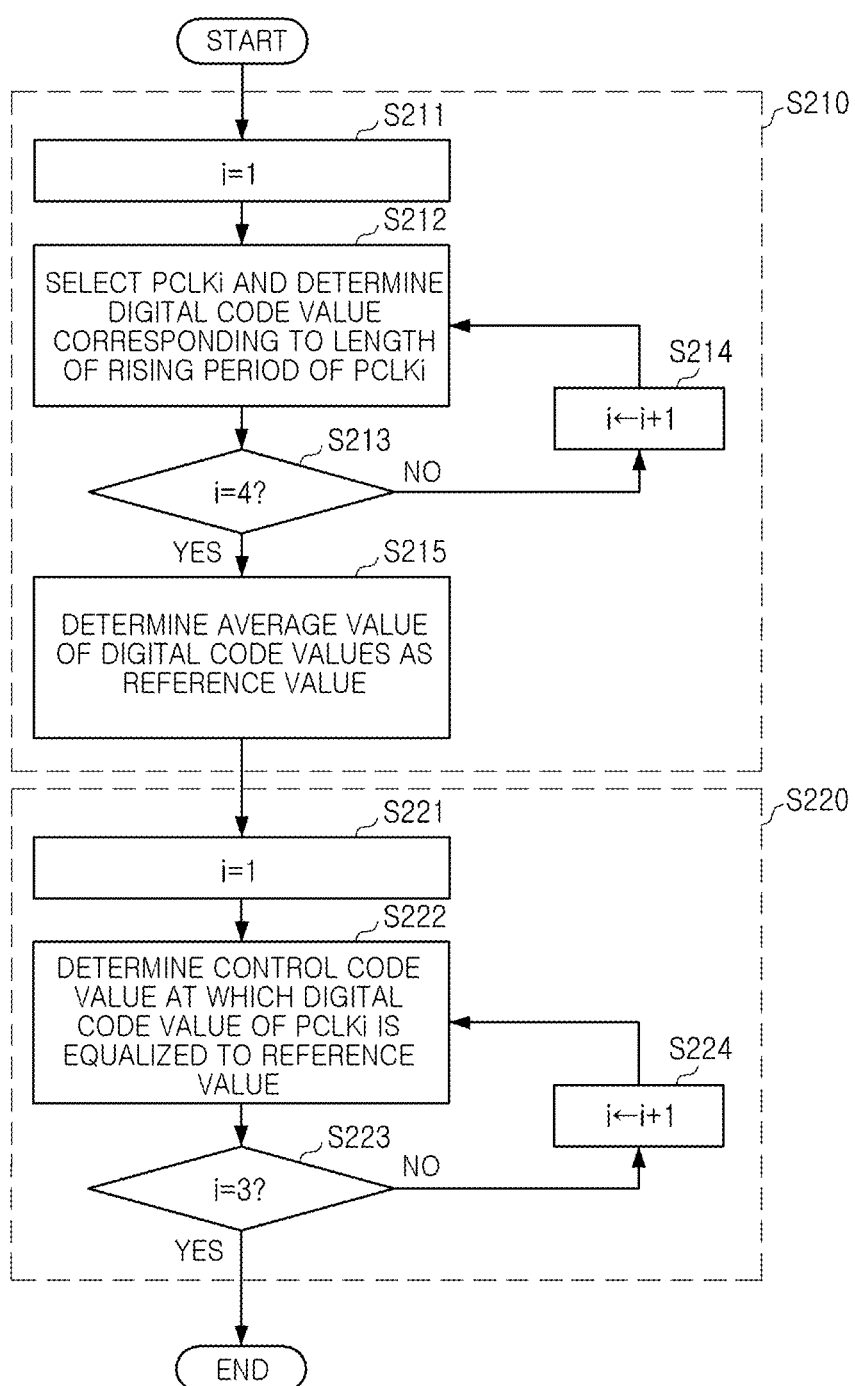
FIG. 12 is a flowchart illustrating a method of detecting and correcting a phase error according to an example embodiment of the present disclosure.

FIG. 12 is a flowchart illustrating a method of detecting and correcting a phase error according to an example embodiment.

Referring to FIG. 12, the method of detecting and correcting a phase error according to an example embodiment may include a method of detecting a phase error of operation S210 and a method of correcting a phase error of operation S220.

In operation S210, operation S211 to operation S215 may be performed, such that lengths of the rising periods of the pulse clock signals PCLK1-PCLK4 may be measured in sequence.

In operation S211, the control circuit 540 may initialize the measurement sequence of the pulse clock signal to "i=1."

In operation S212, the control circuit 540 may select an ith pulse clock signal PCLKi and may determine a digital code value corresponding to a length of a rising period of the pulse clock signal PCLKi.

For example, the control circuit 540 may store a control signal value for activating the ith select signal among the plurality of select signals SEL[4:1] in the mode register 531. The phase error detector 520 may generate a pulse clock signal PCLKi based on a control signal value, and may output a comparison result COMP obtained by comparing the direct current level OUT_A, which is proportional to a length of a rising period of the pulse clock signal PCLKi, with the reference level corresponding to the digital code value provided by the control circuit 540. The comparison result COMP may be provided to the control circuit 540 through the mode register 531. The control circuit 540 may determine the digital code value corresponding to a length of a rising period of the pulse clock signal PCLKi using the comparison result COMP.

An example of the circuit structure of the phase error detector 520 and a specific method by which the control circuit 540 determines the digital code value using the comparison result COMP of the phase error detector 520 will be described later with reference to FIG. 13.

In operation S213, the control circuit 540 may determine whether a digital code value corresponding to a pulse clock signal of the last sequence (i=4) has been obtained.

When the digital code value based on the pulse clock signal of the last sequence is not obtained (in operation S213, "No"), the control circuit 540 in operation S214 may moves to the subsequent sequence (i←i+1), and may perform the measurement of operation S212 on the pulse clock signal of the subsequent sequence. For example, the comparison results COMP corresponding to the first to fourth pulse clock signals PCLK1-PCLK4 may be obtained in sequence.

When the comparison result COMP based on the pulse clock signal of the last sequence is obtained ("Yes" in operation S213), the control circuit 540 may determine an average value of the digital code values as a reference value in operation S215.

Specifically, even when there is an error in the phases of the plurality of clock signals CLKI, CLKQ, CLKIB, and CLKQB, the periods of the plurality of clock signals CLKI, CLKQ, CLKIB, and CLKQB may be the same. Accordingly, an average value of the digital code values of the first to fourth pulse clock signal PCLK1-PCLK4 may be a digital code value of the first to fourth pulse clock signal PCLK1-PCLK4 in the ideal state in which a phase difference between the plurality of clock signals CLKI, CLKQ, CLKIB, and CLKQB is uniform.

Operation S220 may include operation S221 to operation S225. Specifically, in operation S220, by performing operations S221 to operation S225, correction of phase of the multiphase clock may be performed such that each of digital code values based on pulse clock signals PCLK1-PCLK4 may have the reference value.

Correction of a phase of the multiphase clock may include an operation of correcting phases of the other clock signals CLKQ, CLKIB, and CLKQB in sequence with respect to the first clock signal CLKI. The phases of the other clock signals CLKQ, CLKIB, and CLKQB may be controlled by control codes included in the control code set.

In operation S221, the control circuit 540 may initialize the phase correct sequence of the multiphase clock to "i=1."

In operation S222, the control circuit 540 may select an ith control code from the control code set and may determine the control code value at which the digital code value of the ith pulse clock signal PCLKi is equalized to the reference value.

Specifically, the control circuit 540 may generate the ith pulse clock signal PCLKi by inputting an ith select signal to the phase error detector 520, and may control the comparison result COMP proportional to a length of a rising period of the ith pulse clock signal PCLKi to be output.

The control circuit 540 may monitor whether the digital code value is equalized to the reference value while performing a linear search for increasing the ith control code input to the mode register 531 by "1" from the lowest value.

In operation S223, the control circuit 540 may determine whether the control code value of the last sequence (i=3) has been determined.

When the control code value of the last sequence is not determined (in operation S223, "No"), the control circuit 540 may move to the subsequent sequence (i←i+1) in operation S224 and may determine a control code value of the subsequent sequence in operation S222. For example, the first to third control code value may be determined sequentially.

When the control code value of the last sequence is determined (in operation S223, "Yes"), the control circuit 540 may complete correcting the phase of the multiphase clock.

Figure 13:
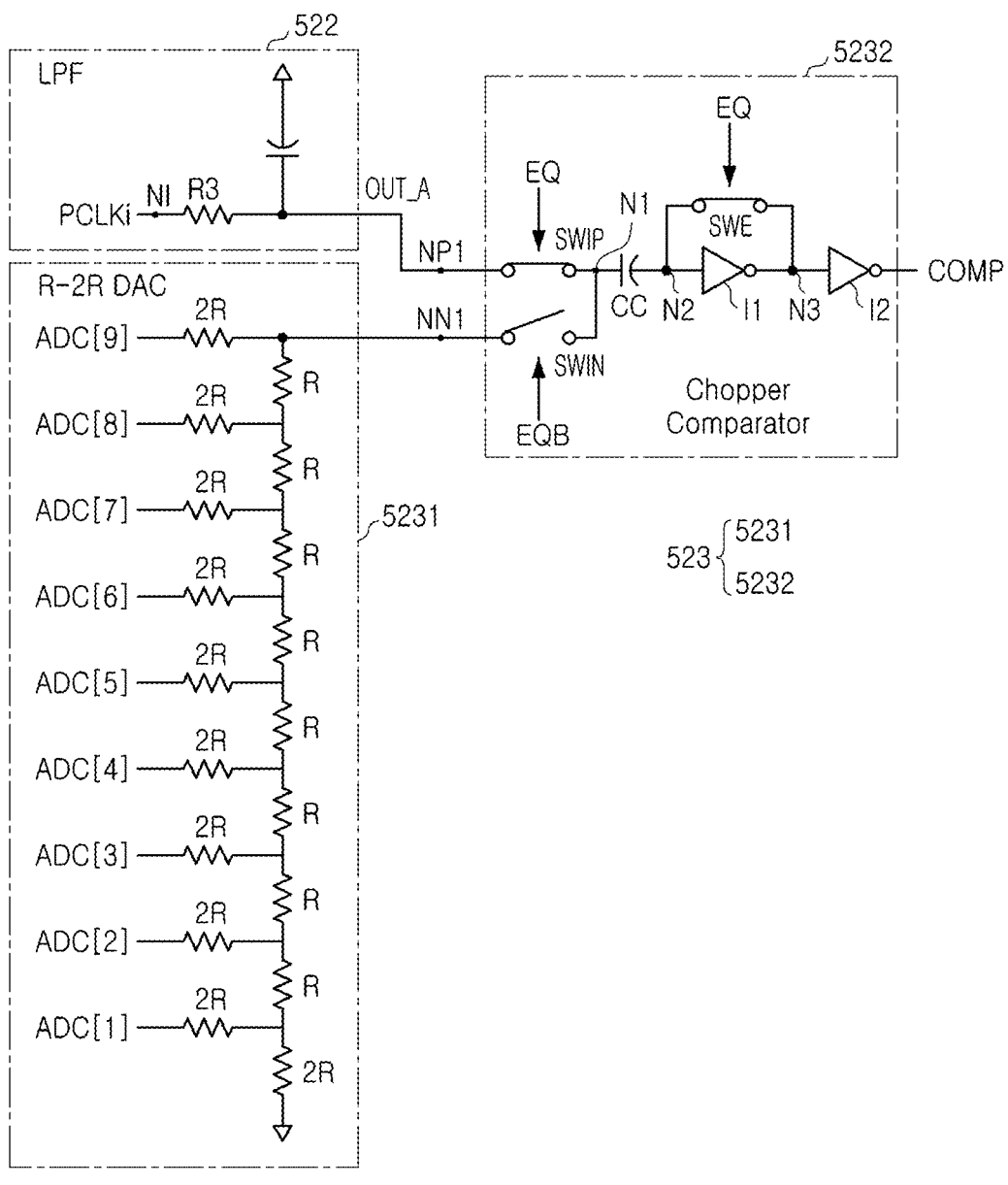
FIG. 13 is a diagram illustrating a circuit structure of a phase error detector according to an example embodiment of the present disclosure.

FIG. 13 is a diagram illustrating a circuit structure of a phase error detector according to an example embodiment.

FIG. 13 illustrates the low-pass filter 522 and the ADC 523 of the phase error detector 520 described with reference to FIG. 11.

The low-pass filter 522 may include an RC circuit. Specifically, the low-pass filter 522 may include a third resistor R3 connected between an input node NI of the low-pass filter 522 and a positive input node NPI, one of the input nodes of ADC 523, and a third capacitor C3 connected between the positive input node NPI and the ground. The low-pass filter 522 may receive the pulse clock signal PCLKi applied to the input node NI and may output the direct current level OUT_A of the pulse clock signal PCLKi to the positive input node NPI. The direct current level OUT_A may be proportional to a length of a rising period in one period of the pulse clock signal PCLKi.

The ADC 523 may include an R-2R digital to analog converter (DAC) 5231 and a chopper comparator 5232.

The R-2R DAC 5231 may include a ladder network including resistor elements having a resistor value R or resistor elements having a resistor value 2R, and may output a reference level corresponding to the value of the digital code ADC[9:1] connected to the resistor elements. A value of digital code ADC[9:1] (i.e., a first digital code value) may be input through the control circuit 540 and the mode register 531. For example, the first digital code value may be stored in the mode register 531, and the control circuit 540 may provide the first digital code value stored in the mode register 531 to the R-2R DAC 5231. FIG. 13 illustrates an example in which the digital code is a 9-bit code, but an example embodiment thereof is not limited thereto.

The chopper comparator 5232 may output a result signal OUT_A by comparing the direct current signal OUT_A corresponding to a length of a rising period of the pulse clock signal PCLKi with an output signal of the R-2R DAC 5231.

For example, the chopper comparator 5232 may include at least a positive input switch SWIP, a negative input switch SWIN, a coupling capacitor CC, an equalization switch SWE, a first inverter I1 and a second inverter I2.

The positive input switch SWIP may electrically connect the positive input node NPI to the first node N1 based on the equalization signal EQ corresponding to the equalization period, and the negative input switch SWIN may electrically connect the negative input node NNI to the first node N1 based on the inverted equalization signal EQB corresponding to the sampling period.

The coupling capacitor CC may be connected between a first node N1 and a second node N2.

The first inverter I1 may be connected between the second node N2 and a third node N3. The equalization switch SWE may electrically connect the second node N2 to the third node N3 based on the equalization signal EQ. The second inverter I2 may be connected to the third node N3, and may output the comparison result COMP by performing inverted amplification on the comparison result signal output to the third node N3.

The structure of the chopper comparator 5232 illustrated in FIG. 13 may be merely an example, and the chopper comparator 5232 may have a differential structure as described with reference to FIG. 10.

The operation in which the ADC 523 may convert the direct current level OUT_A into a digital signal may be controlled by the control circuit 540. For example, the control circuit 540 may change the digital code ADC[9:1] input to the R-2R DAC 5231 and may compare reference levels corresponding to the plurality of digital code values with the direct current level OUT_A. The control circuit 540 may find the digital code value when the comparison signal COMP2 toggles from "0" to "1" or "1" to "0" among the plurality of digital code values, and the digital code value may be determined as a digital value proportional to the direct current level OUT_A. In an example embodiment, the control circuit 540 may determine code values input to the R-2R DAC 5231 using a binary search technique.

In an example embodiment described with reference to FIGS. 11 to 13, the control logic 540 may determine digital code values corresponding to lengths of rising periods of pulse clock signals based on the comparison result COMP generated by the phase error detector 520, and may determine the reference value based on the digital code values. The control logic 540 may correct a phase interval of the multiphase clock by performing a search for a control code set based on the reference value. In example embodiments, the control logic 540 may be included in the control logic circuit 210 described with reference to FIG. 5 or may be included in a memory controller provided externally of the memory device 200.

The phase error detector 520 according to an example embodiment may output a direct current level corresponding to the length of the rising period of pulse clock signals and may perform a function of outputting the result of comparing the direct current level with the digital code value. Accordingly, the phase error detector 520 may have a simplified circuit structure including a select circuit 521, a low-pass filter 522, a R-2R DAC 5231 and a comparator 5232.

In an example embodiment, the multiphase clock corrector 500 may improve speed and accuracy of detecting and correcting the multiphase clock while reducing the increase in circuit area and power consumption of the memory device 200.

The method of performing phase correction by the multiphase clock corrector 500 according to an example embodiment has been described in greater detail with reference to FIGS. 11 to 13. However, an example embodiment thereof is not limited thereto, and the multiphase clock corrector 500 may further perform correction of a duty cycle of a plurality of clock signals CLKI, CLKQ, CLKIB, and CLKQB.

For example, the select circuit 521 in FIG. 11 may further include switches which select one of the plurality of clock signals CLKI, CLKQ, CLKIB, and CLKQB and provide the selected signal to the low-pass filter 522. When one of the plurality of clock signals CLKI, CLKQ, CLKIB, and CLKQB is selected, the low-pass filter 522 may output a direct current level OUT_A corresponding to a rising period of the clock signal, and the ADC 523 may output the comparison result COMP by comparing the reference level corresponding to the digital code value input through the mode register 531 from the control circuit 540 with the direct current level.

The control circuit 540 performs an operation of determining digital code values corresponding to the direct current level OUT_A by performing a search for a digital code with reference to the comparison result COMP for each of the plurality of clock signals CLKI, CLKQ, CLKIB, and CLKQB. The control circuit 540 may determine an average value of digital code values of the first and third clock signals CLKI and CLKIB or the second and fourth clock signals CLKQ and CLKQB, which have inverted phases, as a reference value corresponding to an ideal duty cycle. The control circuit 540 may adjust control codes to control the duty cycle, and may determine values of the control codes at which digital code values of the plurality of clock signals CLKI, CLKQ, CLKIB, CLKQB are equalized to the reference value, thereby performing correcting of duty cycles of the plurality of clock signals CLKI, CLKQ, CLKIB, CLKQB.

In the description below, methods for controlling a phase error by applying a control code set according to an example embodiment will be described in greater detail with reference to FIGS. 14 to 18B.

Figure 14:
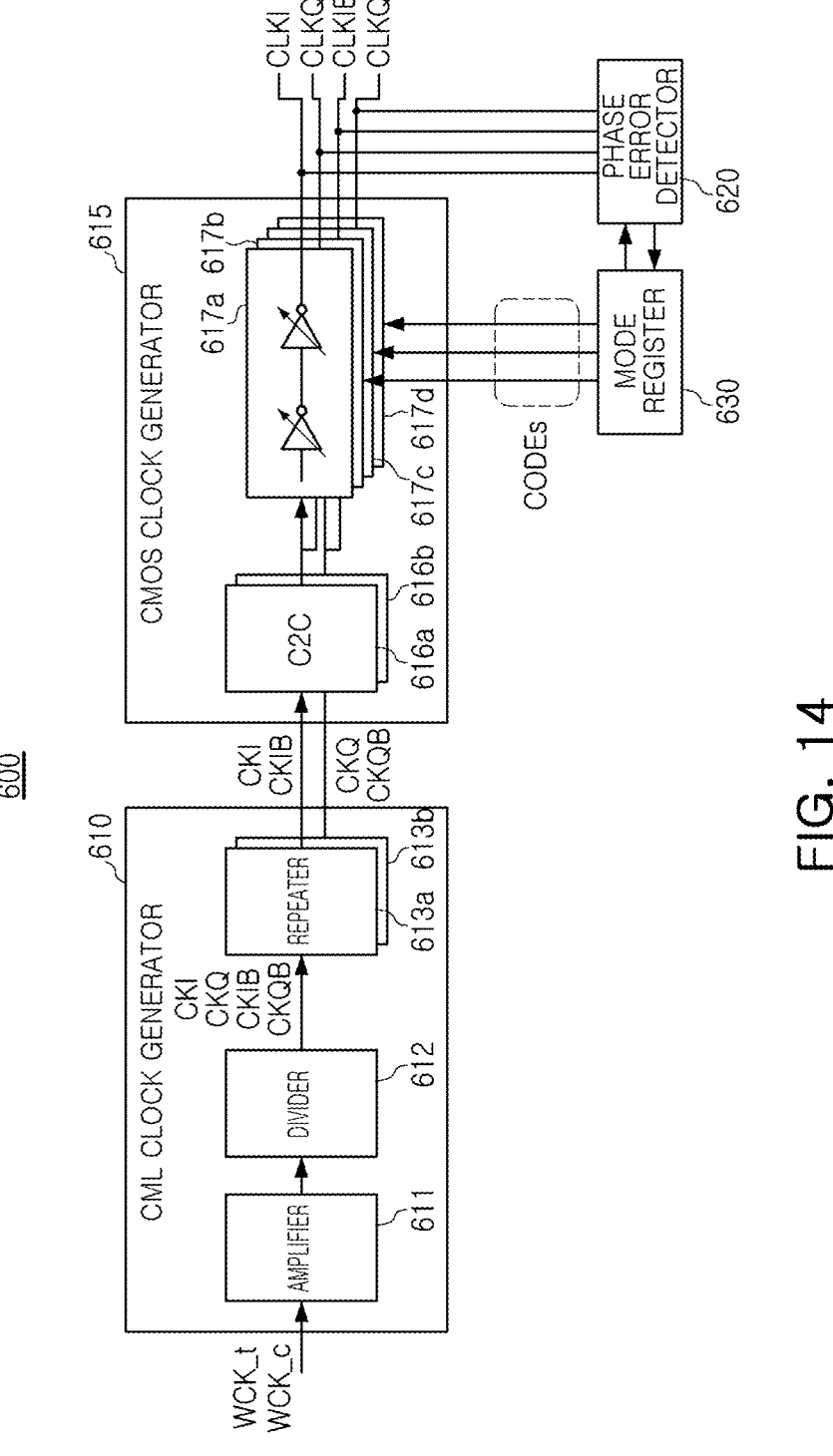
FIG. 14 is a diagram illustrating a phase error correct circuit according to an example embodiment of the present disclosure.

FIG. 14 is a diagram illustrating a phase error correct circuit according to an example embodiment.

In an example embodiment, data clock signals WCK_t and WCK_c may be current mode logic CML signals, and the plurality of clock signals CLKI, CLKQ, CLKIB, and CLKQB may be complementary metal oxide semiconductor (CMOS) signals.

Referring to FIG. 14, the multiphase clock corrector 600 may include a CML clock generator 610 generating a plurality of CML clock signals CKI, CKQ, CKIB, and CKQB by dividing data clock signals WCK_t and WCK_c, a CMOS clock generator 615 generating a plurality of clock signals CLKI, CLKQ, CLKIB, CLKQB by converting the plurality of CML clock signals CKI, CKQ, CKIB, CKQB to CMOS signals, a phase error detector 620 and a mode register 630.

The CML clock generator 610 and CMOS clock generator 615 may correspond to the multiphase clock generator 261 described with reference to FIG. 5.

The CML clock generator 610 may include an amplifier 611, a divider 612 and repeaters 613a and 613b. The divider 612 may output a plurality of CML clock signals CKI, CKQ, CKIB, and CKQB having half a frequency of the data clock signals WCK_t and WCK_c by dividing the data clock signals WCK_t and WCK_c. Ideally, a phase interval between the plurality of CML clock signals CKI, CKQ, CKIB, and CKQB may be 90°.

The amplifier 611 may amplify the data clock signals WCK_t and WCK_c and may provide the signals as an input to the divider 612. The first repeater 613a may amplify and output the CML clock signals CKI and CKIB having mutually inverted phases, and the second repeater 613b may amplify and output the CML clock signals CKQ and CKQB having mutually inverted phases.

The CMOS clock generator 615 may include a plurality of CML to CMOS (C2C) converters 616a and 616b and a plurality of repeaters 617a, 617b, 617c, and 617d. The first C2C converter 616a may generate clock signals CLKI and CLKIB using the CML clock signals CKI and CKIB, and the second C2C converter 616b may generate clock signals CLKQ and CLKQB using the CML clock signals CKQ and CKQB. The plurality of repeaters 617a, 617b, 617c, and

617d may amplify and output the plurality of clock signals CLKI, CLKQ, CLKIB, and CLKQB.

In an example embodiment, each of the plurality of repeaters 617a, 617b, 617c, and 617d may include a variable delay circuit. The phase error detector 620 may detect a phase error by obtaining the plurality of clock signals CLKI, CLKQ, CLKIB, and CLKQB output by the plurality of repeaters 617a, 617b, 617c, and 617d. The control code set CODEs determined by detecting and correcting a phase error may be stored in the mode register 630.

Control code set CODEs may be input to the plurality of repeaters 617b, 617c, and 617d. The plurality of repeaters 617b, 617c, and 617d may control phases of rising edges of the plurality of clock signals CLKQ, CLKIB, and CLKQB by adjusting a delay of a variable delay circuit in response to the control code set CODEs.

In FIG. 14, as an example, the phases of the rising edges of the plurality of clock signals CLKQ, CLKIB, and CLKQB may be controlled by the control code set CODEs input to the plurality of repeaters 617b, 617c, and 617d which amplify the CMOS signal. However, an example embodiment thereof is not limited thereto.

For example, the control code set CODEs may be input to the CML clock generator 610, and direct current levels of the plurality of CML clock signals CKI, CKQ, CKIB, and CKQB may be adjusted based on the control code set CODEs. When direct current levels of the plurality of CML clock signals CKI, CKQ, CKIB, and CKQB are adjusted, phases of the plurality of clock signals CLKI, CLKQ, CLKIB, and CLKQB generated based on the plurality of CML clock signals CKI, CKQ, CKIB, and CKQB may be controlled.

Figure 15:
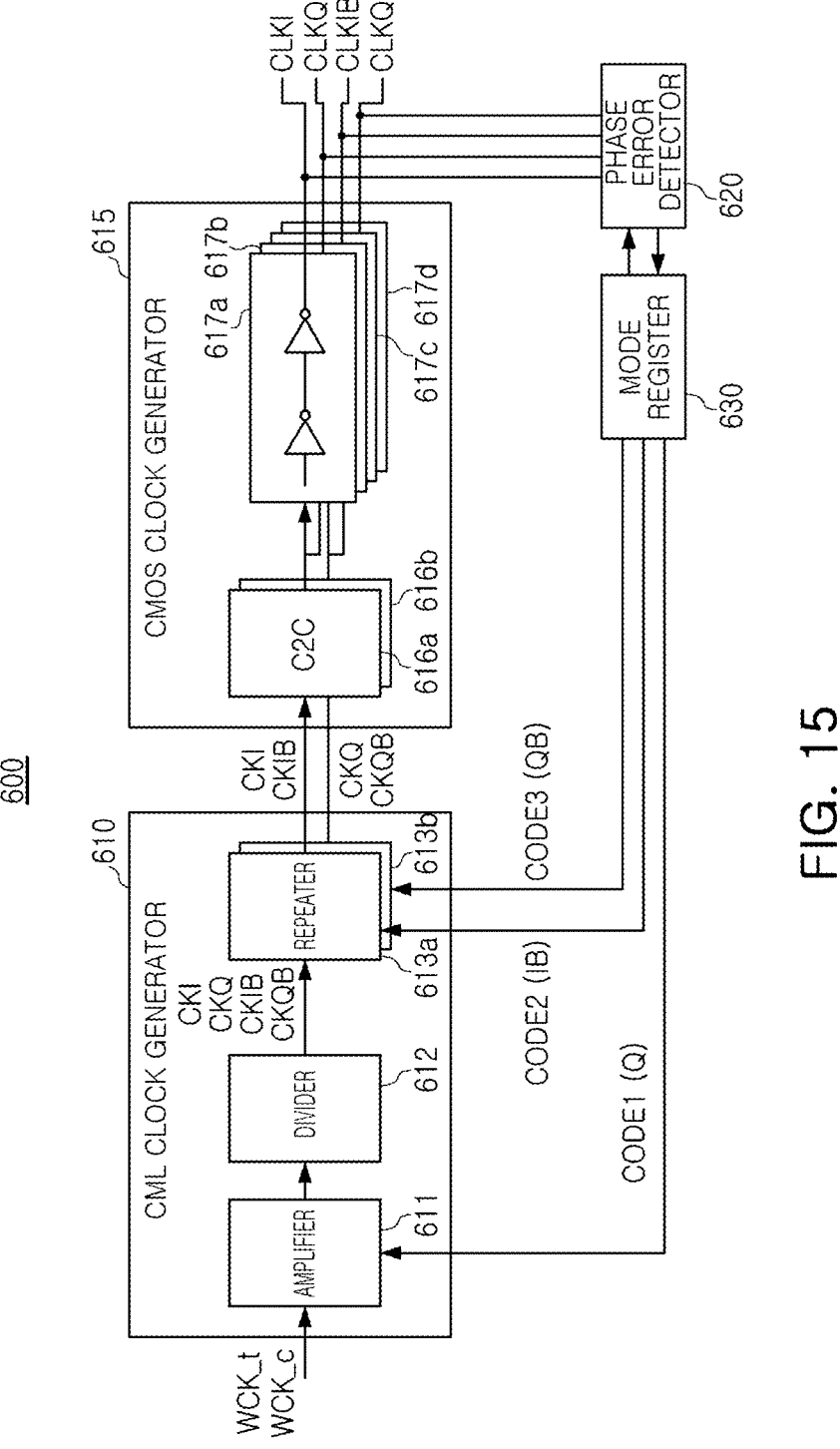
FIG. 15 is a diagram illustrating a phase error correct circuit according to an example embodiment of the present disclosure.

FIG. 15 is a diagram illustrating a phase error correct circuit according to an example embodiment.

Referring to FIG. 15, a multiphase clock corrector 600a may include components similar to the multiphase clock corrector 600 described with reference to FIG. 14. However, in the multiphase clock corrector 600a in FIG. 15, the plurality of repeaters 617a, 617b, 617c, and 617d may not include a variable delay circuit, and the control codes CODE1, CODE2, and CODE3 stored in the mode register 630 may be input to an amplifier 611, a first repeater 613a and a second repeater 613b.

Specifically, the first control code CODE1 for controlling a phase of the second clock signal CLKQ may change a direct current level of the data clock signals WCK_t and WCK_c output by the amplifier 611 by controlling the bias current of the amplifier 611. When the direct current levels of the data clock signals WCK_t and WCK_c change, an interval between rising edges of the first clock signal CLKI and the second clock signal CLKQ may change.

The second control code CODE2 for controlling a phase of the third clock signal CLKIB may change an interval between rising edges of the first clock signal CLKI and the third clock signal CLKIB by controlling a bias current of the first repeater 613a.

Also, the third control code CODE3 for controlling a phase of the fourth clock signal CLKQB may change an interval between rising edges of the second clock signal CLKQ and the fourth clock signal CLKQB by controlling a bias current of the second repeater 613b.

In the description below, before describing a method of controlling phases of the clock signals CLKQ, CLKIB, and CLKQB by controlling bias currents, an example of a circuit structure of a divider and a C2C converter will be described.

Figure 16A:
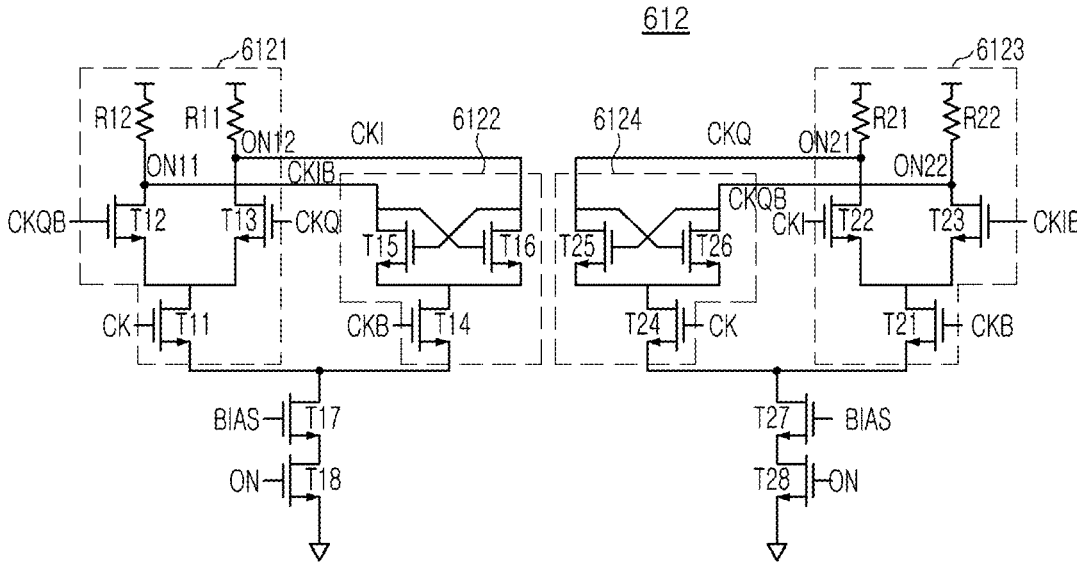
FIGS. 16A and 16B are diagrams illustrating examples of a divider and a C2C converter in FIG. 15.
Figure 16B:
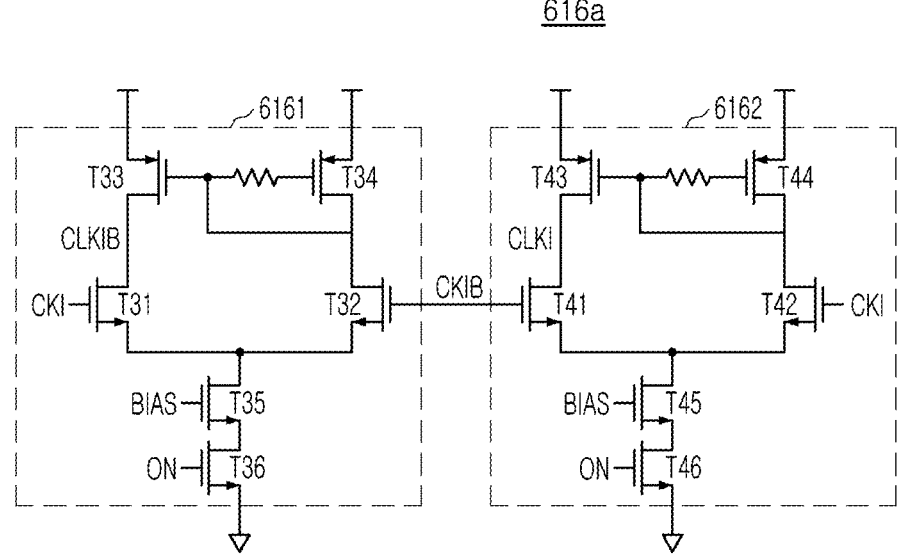

FIGS. 16A and 16B are diagrams illustrating examples of a divider and a C2C converter in FIG. 15. Specifically, FIG.

16A illustrates an example of the divider, and FIG. 16B illustrates an example of the C2C converter.

Referring to FIG. 16A, the divider 612 may include a first level transition circuit 6121, a first level maintenance circuit 6122, a second level transition circuit 6123 and a second level maintenance circuit 6124.

The first level transition circuit 6121 may change logic levels of a first CML clock signal CKI and a third CML clock signal CKIB based on a control clock signal CK, a second CML clock signal CKQ and a fourth CML clock signal CKQB. The first level maintenance circuit 6122 may maintain logic levels of a first CML clock signal CKI and a third CML clock signal CKIB based on a complementary control clock signal CKB, the first CML clock signal CKI and the third CML clock signal CKIB.

The first level transition circuit 6121 may include a first transistor T11, a second transistor T12, a third transistor T13, a first resistor R11 and a second resistor R12. The first to third transistors T11, T12, and T13 may be configured as NMOS transistors.

The first level maintenance circuit 6122 may include a fourth transistor T14, a fifth transistor T15, and a sixth transistor T6. The fourth to sixth transistors T14, T15, and T16 may be configured as NMOS transistors.

The second level transition circuit 6123 may change logic levels of the second CML clock signal CKQ and the fourth CML clock signal CKQB based on the complementary control clock signal CKB, the first CML clock signal CKI and the third CML clock signal CKIB. The second level maintenance circuit 6124 may change logic levels of the second CML clock signal CKQ and the fourth CML clock signal CKQB based on the control clock signal CK, the second CML clock signal CKQ and the fourth CML clock signal CKQB.

The second level transition circuit 6123 may include a first transistor T21, a second transistor T22, a third transistor T23, a first resistor R21 and a second resistor R22. The first to third transistors T21, T22, and T23 may be configured as NMOS transistors.

The second level maintenance circuit 6124 may include a fourth transistor T24, a fifth transistor T25, and a sixth transistor T26. The fourth to sixth transistors T24, T25, and T26 may be configured as NMOS transistors.

The divider 612 may further include seventh and eighth transistors T17 and T18 connected in series between the ground and sources of the first transistor T11 and a fourteenth transistor T14. The divider 612 may further include seventh transistors T27 and T28 connected in series between the ground and the source of the first transistor T21 and a fourth transistor T24. A bias voltage BIAS may be applied to the seventh transistors T17 and T27, and a turn-on voltage ON may be applied to the eighth transistors T18 and T28.

FIG. 16B illustrates the configuration of the first C2C converter 616a. Referring to FIG. 16B, the first C2C converter 616a may include a first CMOS buffer 6161 and a second CMOS buffer 6162.

The first CMOS buffer 6161 may include a first transistor T31 and a second transistor T32. The first and second transistors T31 and T32 may be configured as NMOS transistors. The first CML clock signal CKI may be input to a gate of the first transistor T31, and the third CML clock signal CKIB may be input to a gate of the second transistor T32.

The third transistor T33 may be connected between a drain of the first transistor T31 and a power source, and the fourth transistor T34 may be connected between a drain of the second transistor T32 and a power source. The third and fourth transistors T33 and T34 may be configured as PMOS transistors, and the third and fourth transistors T33 and T34 may be included in a current mirror.

When the third and fourth transistors T33 and T34 are included in a current mirror, and the first clock signal CKI and the third CML clock signal CKIB have inverted phases, a third clock signal CLKIB having a level determined based on the third CML clock signal CKIB may be formed in a drain of the first transistor T31.

The first CMOS buffer 6161 may further include a fifth transistor T35 and a sixth transistor T36 connected in series to sources and ground of the first and second transistors T31 and T32. The fifth and sixth transistor T35 and T36 may be configured as NMOS transistors, a bias voltage BIAS may be applied to the fifth transistor T35, and a turn-on ON voltage may be applied to the sixth transistor T36.

The second CMOS buffer 6162 may have a substantially identical structure to that of the first CMOS buffer 6161 other than the configuration in which the first CML clock signal CKI and the third CML clock signal CKIB may be input in opposite manners, and the first clock signal CLKI having a level determined based on the first CML clock signal CKI may be output.

The second C2C converter 616b in FIG. 15 may have a substantially identical structure to that of the first C2C converter 616a. However, the second CML clock signal CKQ and the fourth CML clock signal CKQB may be input to the second C2C converter 616b instead of the first CML clock signal CKI and the third CML clock signal CKIB. The second C2C converter 616b may output the second clock signal CLKQ and the fourth clock signal CLKQB instead of the first clock signal CLKI and the third clock signal CLKIB.

Figure 17A:
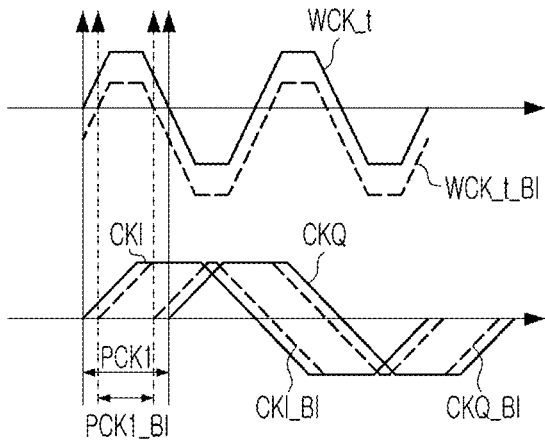
FIGS. 17A and 17B are diagrams illustrating a method of correcting a phase error according to an example embodiment of the present disclosure.
Figure 17B:
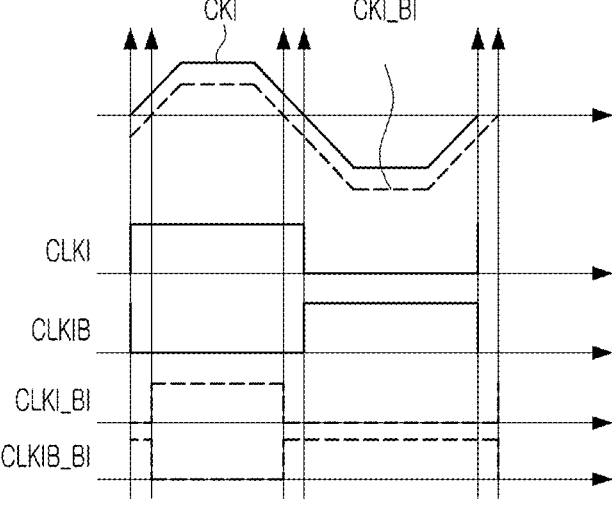

FIGS. 17A and 17B are diagrams illustrating a method of correcting a phase error according to an example embodiment.

FIG. 17A is a diagram illustrating a phase difference between CML clock signals CKI and CKQ generated by a divider 612 according to a direct current level of a data clock signal output by the amplifier 611 described with reference to FIG. 15.

When a bias current is applied to the amplifier 611, a bias data clock signal WCK_t_BI having a direct current level different from that of the data clock signal WCK_t may be output by the amplifier 611. FIG. 17A illustrates an example in which the direct current level of the bias data clock signal WCK_t_BI is lower than the direct current level of the data clock signal WCK_t.

The divider 612 may output an identical phase CML clock signal CKI and an orthogonal phase CML clock signal CKQ based on a rising time point and a falling time point of the data clock signal WCK_t. The rising time point and the falling time point of data clock signal WCK_t may be determined according to a direct current level of the data clock signal WCK_t. An interval between the rising time point and the falling time point of the bias data clock signal WCK_t_BI may be different from an interval between the rising time point and the falling time point of the data clock signal WCK_t.

The divider 612 may output bias CML clock signals CKI_BI and CKQ_BI based on the rising time point and the falling time point of the bias data clock signal WCK_t_BI. Referring to FIG. 17A, the phase interval PCK1 of the CML clock signals CKI and CKQ and the phase interval PCK1_BI of the bias CML clock signals CKI_BI and CKQ_BI may vary. That is, depending on the bias current applied to the amplifier 611, a phase of the orthogonal phase CML clock signal CKQ based on the identical phase CML clock signal CKI may be determined.

FIG. 17B illustrates a phase difference between clock signals CLKI and CLKIB generated in a C2C converter 616a according to direct current levels of CML clock signals CKI and CKIB output by the first repeater 613a described with reference to FIG. 15.

When a bias current is applied to the first repeater 613a, the bias CML clock signal CKI_BI having a direct current level different from that of the CML clock signal CKI may be output by the first repeater 613a. FIG. 17B illustrates an example in which the direct current level of the bias CML clock signal CKI_BI is lower than the direct current level of the CML clock signal CKI.

The C2C converter 616a may output clock signals CLKI and CLKIB based on a rising time point and a falling time point of the CML clock signal CKI. The rising time point and the falling time point of the CML clock signal CKI may be determined according to a direct current level of the CML clock signal CKI. An interval between the rising time point and the falling time point of the bias CML clock signal CKI_BI may be different from an interval between the rising time point and the falling time point of the CML clock signal CKI.

The C2C converter 616a may output bias clock signals CLKI_BI and CLKIB_BI based on the rising time point and the falling time point of the bias CML clock signal CKI_BI. Referring to FIG. 17B, a phase interval between the clock signals CLKI and CLKIB and a phase interval between the bias clock signals CLKI_BI and CLKIB_BI may vary. That is, depending on the bias current applied to the first repeater 613a, a phase of the third clock signal CLKIB based on an identical phase clock signal CKLI may be determined.

Similarly, a phase difference between the clock signals CLKQ and CLKQB generated in the C2C converter 616b may be determined according to direct current levels of the CML clock signals CKQ and CKQB output by the second repeater 613b.

Figure 18A:
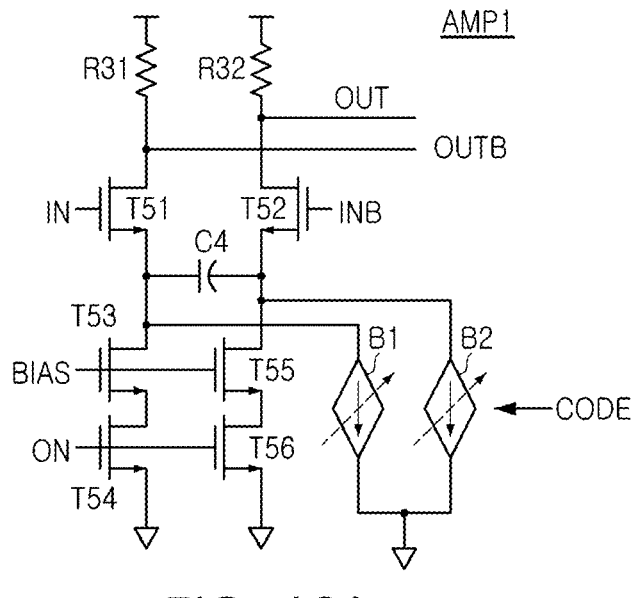
FIGS. 18A and 18B are diagrams illustrating amplifier circuits applicable to a phase error correction circuit according to an example embodiment of the present disclosure.
Figure 18B:
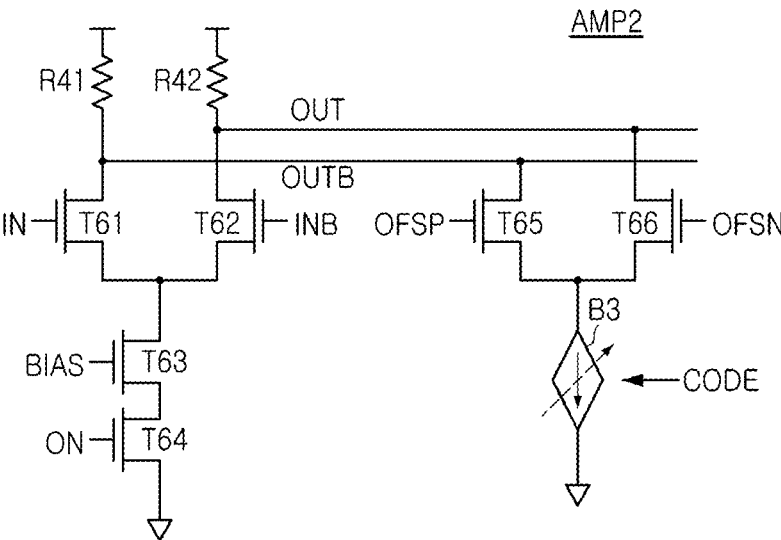

FIGS. 18A and 18B are diagrams illustrating amplifier circuits applicable to a phase error correction circuit according to an example embodiment.

FIG. 18A illustrates a first amplifier circuit applicable to an amplifier 611 and repeaters 613a and 613b according to an example embodiment.

Referring to FIG. 18A, a first amplifier circuit AMP1 may include a first transistor T51, a second transistor T52, a first resistor R31 and a second resistor R32. The first and second transistors T51 and T52 may be configured as NMOS transistors. The first transistor T51, the second transistor T52, the first resistor R31 and the second resistor R32 may have the structure of a differential amplifier configured to amplify an input signal IN and an inverted input signal INB and to output the signals as an output signal OUT and an inverted output signal OUTB. A coupling capacitor C4 may be connected between sources of the first and second transistors T51 and T52.

The first amplifier circuit AMP1 may include third and fourth transistors T53 and T54 connected in series between a source of the first transistor T51 and the ground, and the fifth and sixth transistors T55 and T56 connected in series between a source of the second transistor T52 and the ground. A bias voltage BIAS may be applied to the third and fifth transistors T53 and T55, and a turn-on voltage ON may be applied to the fourth and sixth transistors T54 and T56.

The first amplifier circuit AMP1 may further include a first bias current source B1 connected in parallel to the third and fourth transistors T53 and T54 between the source of the first transistor T51 and the ground, and a second bias current source B2 connected in parallel to the fifth and sixth transistors T55 and T56 between the source of the second transistor T52 and the ground. A current level flowing through each of the first and second bias current sources B1 and B2 may be adjusted by the control code set CODE, and direct current levels of the output signal OUT and the inverted output signal OUTB may be adjusted based on current levels of the first and second bias current sources B1 and B2.

FIG. 18B illustrates a second amplifier circuit applicable to an amplifier 611 and repeaters 613a and 613b according to an example embodiment.

Referring to FIG. 18B, the second amplifier circuit AMP2 may include a first transistor T61, a second transistor T62, a first resistor R41 and a second resistor R42. The first and second transistors T61 and T62 may be configured as NMOS transistors. The first transistor T61, the second transistor T62, the first resistor R41 and the second resistor R42 may have the structure of a differential amplifier configured to amplify the input signal IN and the inverted input signal INB and to output the output signal OUT and the inverted output signal OUTB.

The second amplifier circuit AMP2 may include third and fourth transistors T63 and T64 connected in series between a source of the first and second transistors T61 and T62 and the ground. The third and fourth transistors T63 and T64 may be configured as NMOS transistors, a bias voltage BIAS may be applied to the third transistor T63, and a turn-on voltage ON may be applied to the fourth transistor T64.

The second amplifier circuit AMP2 may further include a fifth transistor T65 of which a drain is connected to a drain of the first transistor T61, and a sixth transistor T66 of which a drain is connected to a drain of the second transistor T62. The fifth and sixth transistor T65 and T66 may be configured as NMOS transistors, and a positive offset voltage OFSP may be applied to the fifth transistor T65, and a negative offset voltage OFSN may be applied to the sixth transistor T66.

A bias current source B3 may be connected between a source of the fifth and sixth transistors T65 and T66 and the ground. The fifth and sixth transistors T63 and T64 may be configured as NMOS transistors. When the fifth and sixth transistors T65 and T66 are turned on by a positive offset voltage OFSP and a negative offset voltage OFSN, and the control code set CODE is input to the bias current source B3, the direct current level of the output signal OUT and the inverted output signal OUTB may be adjusted based on the control code set CODE.

When the amplifier circuits AMP1 and AMP2 are applied to the amplifier 611, the input signals IN and INB may be data clock signals WCK_t and WCK_c. In the case in which the amplifier circuits AMP1 and AMP2 are applied to the first repeater 613a, the input signals IN and INB may be the first and third CML clock signals CKI and CKIB. When the amplifier circuits AMP1 and AMP2 are applied to the second repeater 613b, the input signals IN and INB may be the second and fourth CML clock signals CKQ and CKQB.

When phases of the plurality of clock signals CLKI, CLKQ, CLKIB, and CLKQB are controlled by controlling the bias current of the CML clock generator 610, the phase may be controlled without delaying the plurality of clock signals CLKI, CLKQ, CLKIB, and CLKQB such that bandwidths of the plurality of clock signals CLKI, CLKQ, CLKIB, and CLKQB may be improved.

In an example embodiment described with reference to FIGS. 1 to 18B, a detect circuit and a correct circuit for controlling a phase of the multiphase clock may be embedded in a memory device. Accordingly, in a test environment performing a test on a plurality of memory devices, each of the memory devices may individually perform an operation of detecting and correcting a phase.

Figure 19:
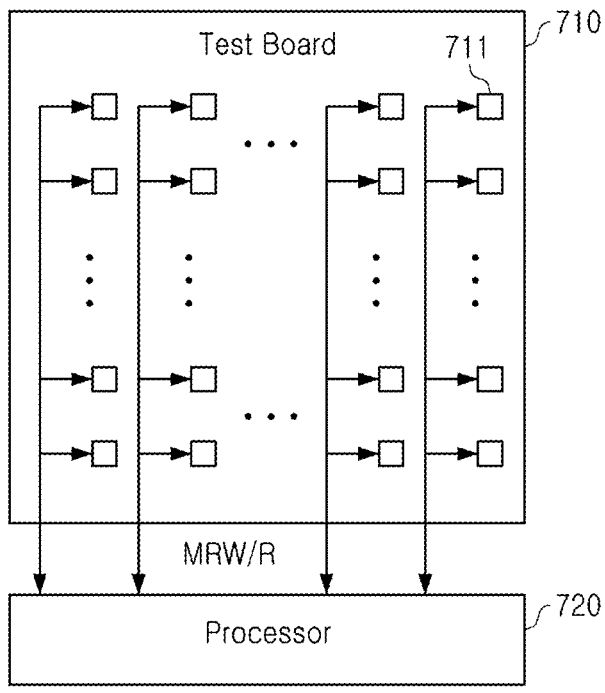
FIG. 19 is a diagram illustrating a test system for testing memory devices according to an example embodiment of the present disclosure.

FIG. 19 is a diagram illustrating a test system for testing memory devices according to an example embodiment.

Referring to FIG. 19, a test system 700 may include a test board 710 and a processor 720.

Automated test equipment (ATE) may include a test assembly designed to perform tests on various package devices, semiconductor wafers, or circuit substrates. The ATE test system 700 including a test board 710 on which the plurality of memory devices 711, the testing targets, are mounted, and a processor 720 controlling the test board 710 may simplify a test process and may test whether the plurality of memory devices 711 operate as intended.

The processor 720 may perform a test of the plurality of memory devices 711 by applying a signal to the plurality of memory devices 711 through the test board 710. When the processor 720 obtains a current level of the signal output by a signal pad of each of the plurality of memory devices 711, and performs an operation of detecting and correcting of a phase error of a multiphase clock of each of the plurality of memory devices 711 based on the current level, the test time may be lengthened. For example, multiphase clocks of the plurality of memory devices 711 may have a different phase error, and it may be difficult for the processor 720 to simultaneously control the phase errors of the plurality of memory devices 711.

In an example embodiment, each of the plurality of memory devices 711 may include a phase error detect circuit and a correct circuit, such that each of the plurality of memory devices 711 may simultaneously perform an operation of detecting and correcting a phase error in response to the control of the processor 720. In an example embodiment, a control logic for determining a value of the control code for phase correction may also be embedded in the control circuit of the plurality of memory devices 711.

In an example embodiment, speed and accuracy of detecting and correcting a phase error for each of the plurality of memory devices 711 may be improved, and the test speed for the plurality of memory devices 711 may be improved.

According to the aforementioned example embodiments, the memory device may internally detect and correct a phase error of clock signals included in the multiphase clock. Accordingly, performance of detection of phase errors may be improved, and phase errors may be corrected swiftly. In a test environment in which testing of a plurality of memory devices is performed, the plurality of memory devices may simultaneously detect and correct phase errors.

While the example embodiments have been illustrated and described above, it will be configured as apparent to those skilled in the art that modifications and variations could be made without departing from the scope of the present disclosure as defined by the appended claims.

What is claimed is:

1. A semiconductor device comprising:
a multiphase clock generator configured to:
generate a plurality of clock signals by dividing a data clock signal,
adjust phases of the plurality of clock signals based on a control code set to generate a plurality of phase-adjusted clock signals, and output the plurality of phase-adjusted clock signals as a multiphase clock;
a first data strobe module configured to generate a first serial signal by serializing a first data sequence using the multiphase clock;
a second data strobe module configured to generate a second serial signal by serializing a second data sequence using the multiphase clock;
a phase error detector configured to compare a first length of a first rising period of the first serial signal and a second length of a second rising period of the second serial signal to generate a comparison result;
a register configured to store the control code set, the first data sequence, the second data sequence, and the comparison result; and
a control logic connected to the register and configured to:
determine code values of the control code set by referring to the comparison result so that phase intervals between the plurality of clock signals are equalized with each other, and
correct a phase of the multiphase clock by storing the code values of the control code set in the register.

2. The semiconductor device of claim 1,
wherein the phase error detector includes:
a first low-pass filter configured to output a first direct current level corresponding to the first length of the first rising period of the first serial signal,
a second low-pass filter configured to output a second direct current level corresponding to the second length of the second rising period of the second serial signal, and
a comparator configured to output the comparison result obtained by comparing the first direct current level with the second direct current level.

3. The semiconductor device of claim 2,
wherein the comparator includes a chopper comparator configured to alternately select the first direct current level and the second direct current level in an equalization period and a sampling period.

4. The semiconductor device of claim 2,
wherein the comparator includes:
an input circuit configured to:
alternately select the first direct current level and the second direct current level based on an equalization signal and an inverted equalization signal,
output a positive amplified input signal through a positive sampling node, and
output a negative amplified input signal through a negative sampling node;
a first coupling circuit including a first positive coupling capacitor connected between the positive sampling node and a first positive node, and a first negative coupling capacitor connected between the negative sampling node and a first negative node;
a first inverted amplifier circuit including a first positive inverter connected between the first positive node and a second positive node, a first negative inverter connected between the first negative node and a second negative node, a first positive equalization switch configured to electrically connect the first positive node to the second positive node based on the inverted equalization signal, and a first negative equalization switch configured to electrically connect the first negative node to the second negative node based on the inverted equalization signal;
a second coupling circuit including a second positive coupling capacitor connected between the second positive node and a third positive node, and a second negative coupling capacitor connected between the second negative node and a third negative node;

a second inverted amplifier circuit including a second positive inverter connected between the third positive node and a fourth positive node, a second negative inverter connected between the third negative node and a fourth negative node, a second positive equalization switch configured to electrically connect the third positive node to the fourth positive node based on the inverted equalization signal, and a second negative equalization switch configured to electrically connect the third negative node to the fourth negative node based on the inverted equalization signal;

a third positive inverter connected to the fourth positive node and configured to receive a positive comparison result outputted to the fourth positive node and generate a positive output signal from the positive comparison result; and a fourth positive inverter connected to the fourth negative node and configured to receive a negative comparison result outputted to the fourth negative node and generate a negative output signal from the negative comparison result.

5. The semiconductor device of claim 4, wherein the comparator further includes a first latching switch configured to electrically connect the fourth positive node to the third negative node based on a latch signal activated in an activation period of the inverted equalization signal, and a second latching switch configured to electrically connect the third positive node to the fourth negative node based on the latch signal.

6. The semiconductor device of claim 5, wherein the comparator further includes a positive feedback switch configured to electrically connect the fourth positive node to the first positive node based on the latch signal, and a negative feedback switch configured to electrically connect the fourth negative node to the first negative node based on the latch signal.

7. A semiconductor device comprising:

a multiphase clock generator configured to generate a first clock signal and a second clock signal having a phase inverted from the first clock signal using a data clock signal, to adjust the phase of the second clock signal based on a first control code, and to output a multiphase clock including the first clock signal and the second clock signal;

a first serializer configured to output a first serial signal by serializing a first data sequence using the multiphase clock;

a second serializer configured to output a second serial signal by serializing a second data sequence using the multiphase clock;

a phase error detector connected to the first serializer and the second serializer and configured to output a first comparison result by comparing a first rising period of the first serial signal and a second rising period of the second serial signal; and a control logic configured to:

control the first serializer to generate the first serial signal having the first rising period between a first rising edge of the first clock signal and a second rising edge of the second clock signal by inputting the first data sequence to the first serializer, control the second serializer to generate the second serial signal having the second rising period between the second rising edge of the second clock signal and the first rising edge of the first clock signal by inputting the second data sequence to the second serializer, obtain the first comparison result from the phase error detector, and correct the phase of the second clock signal by determining a value of the first control code based on the first comparison result.

8. The semiconductor device of claim 7, wherein the control logic is configured to determine a code value as the value of the first control code when the first comparison result toggles in performing a search on the first control code, and wherein the control logic is configured to increase or decrease the code value in the performing of the search on the first control code.

9. The semiconductor device of claim 7, wherein the multiphase clock generator is further configured to generate a third clock signal having a phase orthogonal to the first clock signal and a fourth clock signal having a phase inverted orthogonally to the first clock signal, to adjust the phase of the third clock signal based on a second control code, and to adjust the phase of the fourth clock signal based on a third control code, and the multiphase clock further includes the third clock signal and the fourth clock signal, and wherein the control logic is configured to control the first serializer to generate a third serial signal having a third rising period between the first rising edge of the first clock signal and a third rising edge of the third clock signal by inputting a third data sequence to the first serializer, to control the second serializer to generate a fourth serial signal having a fourth rising period between the third rising edge of the third clock signal and the second rising edge of the second clock signal by inputting a fourth data sequence to the second serializer, to obtain a second comparison result obtained by comparing the third rising period of the third serial signal and the fourth rising period of the fourth serial signal from the phase error detector, and to correct the phase of the third clock signal by determining a value of the second control code based on the second comparison result.

10. The semiconductor device of claim 9, wherein the control logic is configured to control the first serializer to generate a fifth serial signal having a fifth rising period between the first rising edge of the first clock signal and a fourth rising edge of the fourth clock signal by inputting a fifth data sequence to the first serializer, to control the second serializer to generate a sixth serial signal having a sixth rising period between the fourth rising edge of the fourth clock signal and the second rising edge of the second clock signal by inputting a sixth data sequence to the second serializer, to obtain a third comparison result obtained by comparing the fifth rising period of the fifth serial signal and the sixth rising period of the sixth serial signal from the phase error detector, and to correct the phase of the fourth clock signal by determining a value of the third control code based on the third comparison result.

11. A semiconductor device, comprising:

a multiphase clock generator configured to:

generate a plurality of clock signals by dividing a data clock signal, adjust a phase of each of the plurality of clock signals based on a control code set to generate a plurality of phase-adjusted clock signals, and output the plurality of phase-adjusted clock signals as a multiphase clock;

a phase error detector configured to:

generate a plurality of pulse clock signals from the plurality of phase-adjusted clock signals, wherein each of the plurality of pulse clock signals has a rising period between rising edges of corresponding two adjacent phase-adjusted clock signals among the plurality of phase-adjusted clock signals, and wherein the corresponding two adjacent phase-adjusted clock signals are selected from the plurality of phase-adjusted clock signals based on a select signal, and output a plurality of comparison results, wherein each of the plurality of comparison results is obtained by comparing a direct current level corresponding to a length of a rising period of a corresponding one of the plurality of pulse clock signals and a reference level corresponding to an input digital code value;

a register configured to store the control code set, the select signal and the plurality of comparison results; and a control logic connected to access to the register, and configured to:

repeatedly perform an operation of determining a corresponding digital code value corresponding to the direct current level by performing a search for candidate input digital code values on the plurality of pulse clock signals to generate a plurality of corresponding digital code values of the plurality of pulse clock signals, determine a reference value based on the plurality of corresponding digital code values of the plurality of pulse clock signals, determine the control code set in which each of the plurality of corresponding digital code values of the plurality of pulse clock signals is equalized to the reference value, and correct a phase of the multiphase clock by inputting the determined control code set to the register.

12. The semiconductor device of claim 11,
wherein the phase error detector includes:

a select circuit configured to select the corresponding two adjacent phase-adjusted clock signals based on the select signal and to generate a first pulse clock signal of the plurality of pulse clock signals using the corresponding two adjacent phase-adjusted clock signals;

a low-pass filter configured to receive the first pulse clock signal and to output a first direct current level corresponding to the rising period of the first pulse clock signal;

a R-2R digital to analog converter (R-2R DAC) configured to output the reference level corresponding to the input digital code value provided by the control logic through the register; and a comparator configured to output a result of comparing the first direct current level with the reference level as a first comparison result of the plurality of comparison results.

13. The semiconductor device of claim 12,
wherein the control logic is configured to determine a code value as a value of a first control code when the first comparison result toggles in performing a search on the first control code.

14. The semiconductor device of claim 12,
wherein the comparator includes a chopper comparator configured to alternately select the direct current level and the reference level in an equalization period and a sampling period.

15. The semiconductor device of claim 12,
wherein the select circuit includes:

a plurality of switches configured to output the corresponding two adjacent phase-adjusted clock signals based on the select signal;

an inverter circuit configured to invert one of the corresponding two adjacent phase-adjusted clock signals, wherein the one of the corresponding two adjacent phase-adjusted clock signals is delayed compared to the other of the corresponding two adjacent phase-adjusted clock signals; and an AND gate configured to output an AND operation result of the inverted one of the corresponding two adjacent phase-adjusted clock signals and the other of the corresponding two adjacent phase-adjusted clock signals.

16. The semiconductor device of claim 11,
wherein the data clock signal is configured as a differential current mode logic (CML) signal, wherein the plurality of clock signals are configured as a plurality of complementary metal oxide semiconductor (CMOS) signals, and wherein the multiphase clock generator includes:

a CML clock generator configured to generate a plurality of CML clock signals by dividing the data clock signal, and a CMOS clock generator configured to generate the plurality of clock signals by performing C2C (CML to CMOS) conversion of the plurality of CML clock signals.

17. The semiconductor device of claim 16,
wherein the CMOS clock generator includes a plurality of variable delay circuits connected to the plurality of clock signals, respectively, and is configured to generate the plurality of phase-adjusted clock signals by controlling the plurality of variable delay circuits based on the control code set.

18. The semiconductor device of claim 16,
wherein the CML clock generator includes:

an amplifier configured to amplify the data clock signal;

a divider configured to generate the plurality of clock signals including an identical phase CML clock signal, an orthogonal phase CML clock signal, an inverted identical phase CML clock signal and an inverted orthogonal phase CML clock signal by dividing the data clock signal outputted by the amplifier;

a first repeater configured to amplify the identical phase CML clock signal and the inverted identical phase CML clock signal; and a second repeater configured to amplify the orthogonal phase CML clock signal and the inverted orthogonal phase CML clock signal, wherein the amplifier is configured to control a phase of the orthogonal phase CML clock signal among the plurality of clock signals by controlling a first bias current based on a first control code included in the control code set, wherein the first repeater is configured to control a phase of an inverted identical phase clock signal among the plurality of clock signals by controlling a second bias current based on a second control code included in the control code set, and wherein the second repeater is configured to control a phase of an inverted orthogonal phase clock signal among the plurality of clock signals by controlling a third bias current based on a third control code included in the control code set.

19. The semiconductor device of claim 11, wherein the register includes:

a mode register accessed by the control logic in a normal mode, and a test mode register accessed by the control logic in a test mode.

20. The semiconductor device of claim 19, wherein the multiphase clock generator, the phase error detector and the register are included in a memory device, wherein the control logic is included in a memory controller configured to control the memory device, and wherein the control logic is configured to access the mode register using a mode register read (MRR) command and a mode register write (MRW) command and to access the test mode register set using a test mode register set (TMRS) command.

\*    \*    \*    \*    \*